US012608972B2

(12) United States Patent
Song et al.

(10) Patent No.: US 12,608,972 B2
(45) Date of Patent: \*Apr. 21, 2026

(54) DISPLAY DEVICE

(71) Applicant: Samsung Display Co., Ltd., Yongin-Si (KR)

(72) Inventors: Heerim Song, Yongin-si (KR); Heejean Park, Yongin-si (KR); Yujin Lee, Yongin-si (KR); Cheol-Gon Lee, Yongin-si (KR); Mukyung Jeon, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/791,434

(22) Filed: Aug. 1, 2024

(65) Prior Publication Data

US 2024/0395065 A1 Nov. 28, 2024

Related U.S. Application Data

(63) Continuation of application No. 18/097,514, filed on Jan. 17, 2023, now Pat. No. 12,087,082.

(30) Foreign Application Priority Data

Apr. 7, 2022 (KR) ......................... 10-2022-0043400

(51) Int. Cl.
G06V 40/13 (2022.01)
G09G 3/3233 (2016.01)
(Continued)

(52) U.S. Cl.
CPC ....... G06V 40/1318 (2022.01); G09G 3/3233 (2013.01); H10K 39/34 (2023.02);
(Continued)

(58) Field of Classification Search
CPC .... G06V 40/1318; H10K 39/34; H10K 59/40; H10K 59/1213; G09G 3/3233;
(Continued)

(56) References Cited

U.S. PATENT DOCUMENTS 10,546,902 B2 1/2020 Lee et al.
2017/0234730 A1* 8/2017 Kurokawa ............. G02B 5/201
250/208.1
(Continued)

FOREIGN PATENT DOCUMENTS

KR 10-1213492 B1 12/2012
KR 10-2018-0051692 A 5/2018
KR 10-2021-0004867 A 1/2021

*Primary Examiner* — Peter D McLoone
(74) *Attorney, Agent, or Firm* — Innovation Counsel LLP

(57) ABSTRACT

Disclosed is a display device including a base layer and a pixel layer that is disposed on the base layer and that includes a plurality of pixels and a plurality of sensors. Each of the plurality of pixels includes a light emitting element and a pixel drive circuit connected to the light emitting element to control driving of the light emitting element. Each of the plurality of sensors includes a light sensing unit including a plurality of light sensing elements, a sensor drive circuit that is connected to at least two light sensing elements and that outputs a sensing signal in response to light, and a routing wire that electrically connects the at least two light sensing elements to each other.

20 Claims, 22 Drawing Sheets

(51) Int. Cl.

| | | |
|---|---|---|
| *H10K 39/34* | (2023.01) | |
| *H10K 59/121* | (2023.01) | |
| *H10K 59/40* | (2023.01) | |

(52) U.S. Cl.
CPC ......... *H10K 59/1213* (2023.02); *H10K 59/40* (2023.02); *G09G 2300/0426* (2013.01); *G09G 2300/0819* (2013.01); *G09G 2300/0842* (2013.01); *G09G 2300/0861* (2013.01); *G09G 2310/08* (2013.01); *G09G 2354/00* (2013.01)

(58) Field of Classification Search
CPC ... G09G 2300/0416; G09G 2300/0819; G09G 2300/0842; G09G 2300/0861; G09G 2310/08; G09G 2354/00
See application file for complete search history.

(56) References Cited

U.S. PATENT DOCUMENTS

| | | | |
|---|---|---|---|
| 2021/0005669 A1 | 1/2021 | Kamada et al. | |
| 2021/0225965 A1 | 7/2021 | Liu et al. | |
| 2021/0326558 A1* | 10/2021 | Lee | G06V 40/1318 |
| 2023/0326404 A1* | 10/2023 | Park | G09G 3/3233 |
| 2024/0257751 A1* | 8/2024 | Yakubo | H10D 84/0126 |

* cited by examiner

DISPLAY DEVICE

CROSS-REFERENCE TO RELATED APPLICATIONS

This application is a continuation application of U.S. patent application Ser. No. 18/097,514 filed on Jan. 17, 2023, which claims priority under 35 U.S.C. § 119 to Korean Patent Application No. 10-2022-0043400 filed on Apr. 7, 2022, in the Korean Intellectual Property Office, the disclosures of which are incorporated by reference herein in their entireties.

BACKGROUND

Embodiments of the present disclosure described herein relate to a display device, and more particularly, relate to a display device capable of biometric information recognition.

A display device provides various functions for communication with a user. For example, the display device may display an image to provide information to the user, or may sense an input of the user. Recent display devices include a function of sensing biometric information of a user.

Biometric information may be recognized by using a capacitive sensing technique for sensing a change in capacitance formed between electrodes, a light sensing technique for sensing incident light using an optical sensor, or an ultrasonic sensing technique for sensing vibration using a piezoelectric element.

SUMMARY

Embodiments of the present disclosure provide a display device having improved sensing performance of a sensor for biometric information recognition.

According to an embodiment, a display device includes a base layer and a pixel layer that is disposed on the base layer and that includes a plurality of pixels and a plurality of sensors. Each of the plurality of pixels includes a light emitting element and a pixel drive circuit connected to the light emitting element to control driving of the light emitting element. Each of the plurality of sensors includes a light sensing unit including a plurality of light sensing elements, a sensor drive circuit that is connected to at least two light sensing elements and that outputs a sensing signal in response to light, and a routing wire that electrically connects the at least two light sensing elements to each other.

According to an embodiment, a display device includes a base layer, a circuit layer that is disposed on the base layer and that includes a pixel drive circuit and a sensor drive circuit, and an element layer that is disposed on the circuit layer and that includes a light emitting element connected to the pixel drive circuit and a plurality of light sensing elements connected to the sensor drive circuit in parallel.

The sensor drive circuit includes a reset transistor including a first electrode that receives a reset signal, a second electrode connected to a first sensing node, and a third electrode that receives a reset control signal, an amplifying transistor including a first electrode that receives a sensing drive voltage, a second electrode connected to a second sensing node, and a third electrode connected to the first sensing node, and an output transistor including a first electrode connected to the second sensing node, a second electrode connected to a sensing line, and a third electrode that receives an output control signal. The plurality of light sensing elements are connected to the first sensing node in parallel.

BRIEF DESCRIPTION OF THE FIGURES

The above and other objects and features of the present disclosure will become apparent by describing in detail embodiments thereof with reference to the accompanying drawings.

FIG. 3 is a block diagram of the display device according to an embodiment of the present disclosure.

FIG. 10 is a sectional view illustrating a pixel of the display panel according to an embodiment of the present disclosure.

DETAILED DESCRIPTION

Figure 1:
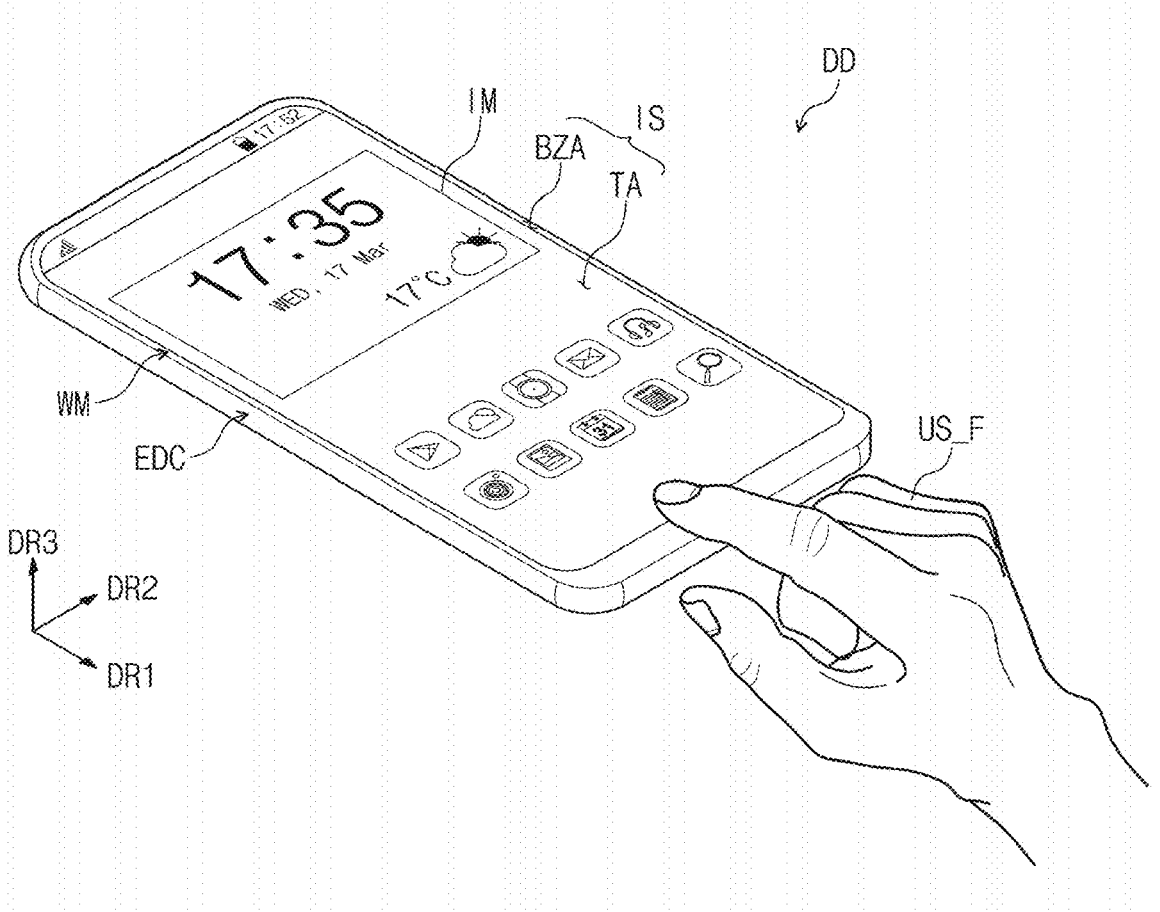
FIG. 1 is a perspective view of a display device according to an embodiment of the present disclosure.

In this specification, when it is mentioned that a component (or, an area, a layer, a part, etc.) is referred to as being "on", "connected to" or "coupled to" another component, this means that the component may be directly on, connected to, or coupled to the other component or a third component may be present therebetween.

Identical reference numerals refer to identical components. Additionally, in the drawings, the thicknesses, proportions, and dimensions of components are exaggerated for effective description. As used herein, the term "and/or" includes all of one or more combinations defined by related components.

Terms such as first, second, and the like may be used to describe various components, but the components should not be limited by the terms. The terms may be used only for distinguishing one component from other components. For example, without departing the scope of the present disclosure, a first component may be referred to as a second component, and similarly, the second component may also be referred to as the first component. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Hereinafter, embodiments of the present disclosure will be described with reference to the accompanying drawings.

Figure 2:
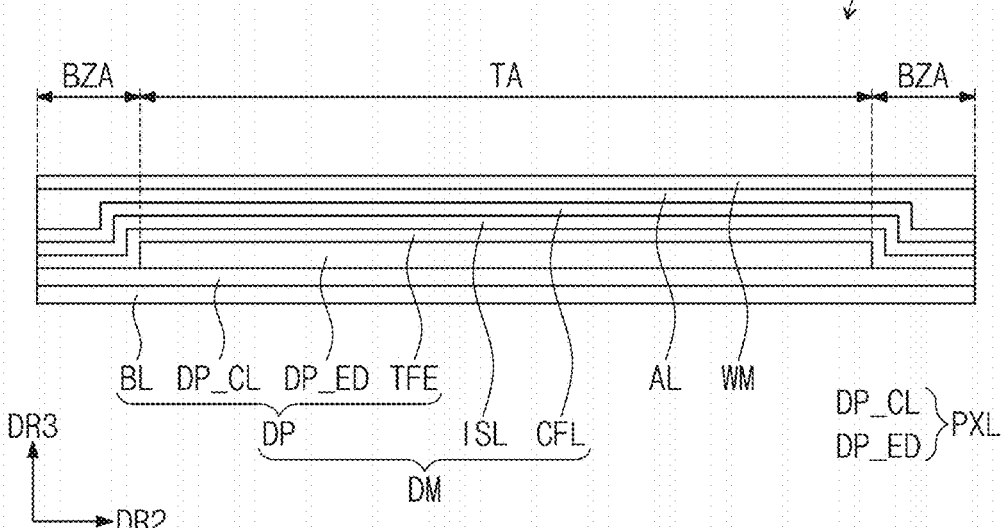
FIG. 2 is a sectional view of the display device according to an embodiment of the present disclosure.

FIG. 1 is a perspective view of a display device according to an embodiment of the present disclosure, and FIG. 2 is a sectional view of the display device according to an embodiment of the present disclosure.

Referring to FIGS. 1 and 2, the display device DD according to an embodiment of the present disclosure may have a rectangular shape with long sides parallel to a first direction DR1 and short sides parallel to a second direction DR2 crossing the first direction DR1. However, without being limited thereto, the display device DD may have various shapes such as a circular shape, a polygonal shape, and the like.

The display device DD may be a device activated in response to an electrical signal. The display device DD may include various embodiments. For example, the display device DD may be applied to electronic devices such as a smart watch, a tablet computer, a notebook computer, a computer, a smart television, and the like.

Hereinafter, a normal direction substantially perpendicular to a plane defined by the first direction DR1 and the second direction DR2 is defined as a third direction DR3. As used herein, the expression "when viewed on the plane" and/or "in a plan view" may mean that it is viewed in the third direction DR3.

An upper surface of the display device DD may be defined as a display surface IS and may be parallel to the plane defined by the first direction DR1 and the second direction DR2. Images IM generated by the display device DD may be provided to a user through the display surface IS.

The display surface IS may include a transmissive area TA and a bezel area BZA. The transmissive area TA may be an area where the images IM are displayed. The user visually recognizes the images IM through the transmissive area TA. In this embodiment, the transmissive area TA is illustrated in a rounded rectangular shape. However, this is illustrative, and the transmissive area TA may have various shapes and is not limited to any one embodiment.

The bezel area BZA is disposed adjacent to the transmissive area TA. The bezel area BZA may have a predetermined color. The bezel area BZA may surround the transmissive area TA. Accordingly, the shape of the transmissive area TA may be substantially defined by the bezel area BZA. However, this is illustrative, and the bezel area BZA may be disposed adjacent to only one side of the transmissive area TA, or may be omitted.

The display device DD may sense an external input applied from the outside. The external input may include various forms of inputs provided from outside the display device DD. For example, the external input may include not only contact by a body part such as a hand US_F of the user or contact by a separate device (e.g., an active pen or a digitizer) but also an external input (e.g., hovering) that is applied in proximity to the display device DD or applied adjacent to the display device DD at a predetermined distance. Furthermore, the external input may have various forms such as force, pressure, temperature, light, and the like.

The display device DD may sense the user's biometric information applied from the outside. A biometric information sensing area capable of sensing the user's biometric information may be provided on the display surface IS of the display device DD. The biometric information sensing area may be provided in the entire region of the transmissive area TA, or may be provided in a partial region of the transmissive area TA. FIG. 1 illustrates one example that the entire transmissive area TA is used as the biometric information sensing area.

The display device DD may include a window WM, a display module DM, and a housing EDC. In this embodiment, the window WM and the housing EDC are coupled to form the exterior of the display device DD.

The front surface of the window WM defines the display surface IS of the display device DD. The window WM may contain an optically clear insulating material. For example, the window WM may contain glass or plastic. The window WM may have a multi-layer structure or a single-layer structure. For example, the window WM may include a plurality of plastic films coupled through an adhesive, or may include a glass substrate and a plastic film coupled through an adhesive.

The display module DM may include a display panel DP and an input sensing layer ISL. The display panel DP may display an image in response to an electrical signal, and the input sensing layer ISL may sense an external input applied from the outside. The external input may be provided in various forms.

The display panel DP according to an embodiment of the present disclosure may be an emissive display panel, but is not particularly limited. For example, the display panel DP may be an organic light emitting display panel, an inorganic light emitting display panel, or a quantum-dot light emitting display panel. A light emitting layer of the organic light emitting display panel may contain an organic light emitting material, and a light emitting layer of the inorganic light emitting display panel may contain an inorganic light emitting material. A light emitting layer of the quantum-dot light emitting display panel may contain quantum dots or quantum rods. Hereinafter, the display panel DP will be described as an organic light emitting display panel.

Referring to FIG. 2, the display panel DP includes a base layer BL, a pixel layer PXL, and an encapsulation layer TFE. The display panel DP according to the present disclosure may be a flexible display panel. However, the present disclosure is not limited thereto. For example, the display panel DP may be a foldable display panel that is folded about a folding axis, or a rigid display panel.

The base layer BL may include a synthetic resin layer. The synthetic resin layer may be a polyimide-based resin layer, and the material thereof is not particularly limited. In addition, the base layer BL may include a glass substrate, a metal substrate, or an organic/inorganic composite substrate.

The pixel layer PXL is disposed on the base layer BL. The pixel layer PXL may include a circuit layer DP_CL and an element layer DP_ED. The circuit layer DP_CL is disposed between the base layer BL and the element layer DP_ED. The circuit layer DP_CL includes at least one insulating layer and at least one circuit element. Hereinafter, the insulating layer included in the circuit layer DP_CL is referred to as the intermediate insulating layer. The intermediate insulating layer includes at least one intermediate inorganic film and at least one intermediate organic film. The circuit element may include a pixel drive circuit included in each of a plurality of pixels for displaying an image and a sensor drive circuit included in each of a plurality of sensors for recognizing external information. The external information may be biometric information. In an embodiment of the present disclosure, the sensor may be a fingerprint recognition sensor, a proximity sensor, an iris recognition sensor, or the like. Furthermore, the sensor may be an optical sensor for recognizing biometric information in an optical manner. The circuit layer DP_CL may further include signal lines connected to the pixel drive circuit and/or the sensor drive circuit.

The element layer DP_ED may include a light emitting element included in each of the pixels and a light sensing element included in each of the sensors. In an embodiment of the present disclosure, the light sensing element may be a photo diode. The light sensing element may be a sensor that senses light reflected by a fingerprint of the user or reacts to light. The circuit layer DP_CL and the element layer DP_ED will be described below in detail with reference to FIGS. 10, 11A, and 11B.

The encapsulation layer TFE encapsulates the element layer DP_ED. The encapsulation layer TFE may include at least one organic film and at least one inorganic film. The inorganic film may contain an inorganic material and may protect the element layer DP_ED from moisture/oxygen. The inorganic film may include, but is not particularly limited to, a silicon nitride layer, a silicon oxy-nitride layer, a silicon oxide layer, a titanium oxide layer, or an aluminum oxide layer. The organic film may contain an organic material and may protect the element layer DP_ED from foreign matter such as dust particles.

The input sensing layer ISL may be formed on the display panel DP. The input sensing layer ISL may be directly disposed on the encapsulation layer TFE. According to an embodiment of the present disclosure, the input sensing layer ISL may be formed on the display panel DP by a continuous process. That is, when the input sensing layer ISL is directly disposed on the display panel DP, an adhesive film is not disposed between the input sensing layer ISL and the encapsulation layer TFE. Alternatively, an adhesive film may be disposed between the input sensing layer ISL and the display panel DP. In this case, the input sensing layer ISL may not be manufactured together with the display panel DP by a continuous process and may be manufactured separately from the display panel DP and then fixed to the upper surface of the display panel DP by the adhesive film.

The input sensing layer ISL may sense an external input (e.g., a touch of the user), may change the sensed external input to a predetermined input signal, and may provide the input signal to the display panel DP. The input sensing layer ISL may include a plurality of sensing electrodes for sensing the external input. The sensing electrodes may sense the external input in a capacitive manner. The display panel DP may receive the input signal from the input sensing layer ISL and may generate an image corresponding to the input signal.

The display module DM may further include a color filter layer CFL. In an embodiment of the present disclosure, the color filter layer CFL may be disposed on the input sensing layer ISL. However, the present disclosure is not limited thereto. The color filter layer CFL may be disposed between the display panel DP and the input sensing layer ISL. The color filter layer CFL may include a plurality of color filters and a black matrix.

The structures of the input sensing layer ISL and the color filter layer CFL will be described below in detail.

The display device DD according to an embodiment of the present disclosure may further include an adhesive layer AL. The window WM may be attached to the input sensing layer ISL by the adhesive layer AL. The adhesive layer AL may include an optically clear adhesive, an optically clear adhesive resin, or a pressure sensitive adhesive (PSA).

The housing EDC is coupled with the window WM. The housing EDC is coupled with the window WM to provide a predetermined inner space. The display module DM may be accommodated in the inner space. The housing EDC may contain a material having a relatively high stiffness. For example, the housing EDC may contain glass, plastic, or metal, or may include a plurality of frames and/or plates formed of a combination of the mentioned materials. The housing EDC may stably protect components of the display device DD accommodated in the inner space from an external impact. Although not illustrated, a battery module for supplying power required for overall operation of the display device DD may be disposed between the display module DM and the housing EDC.

Figure 3:
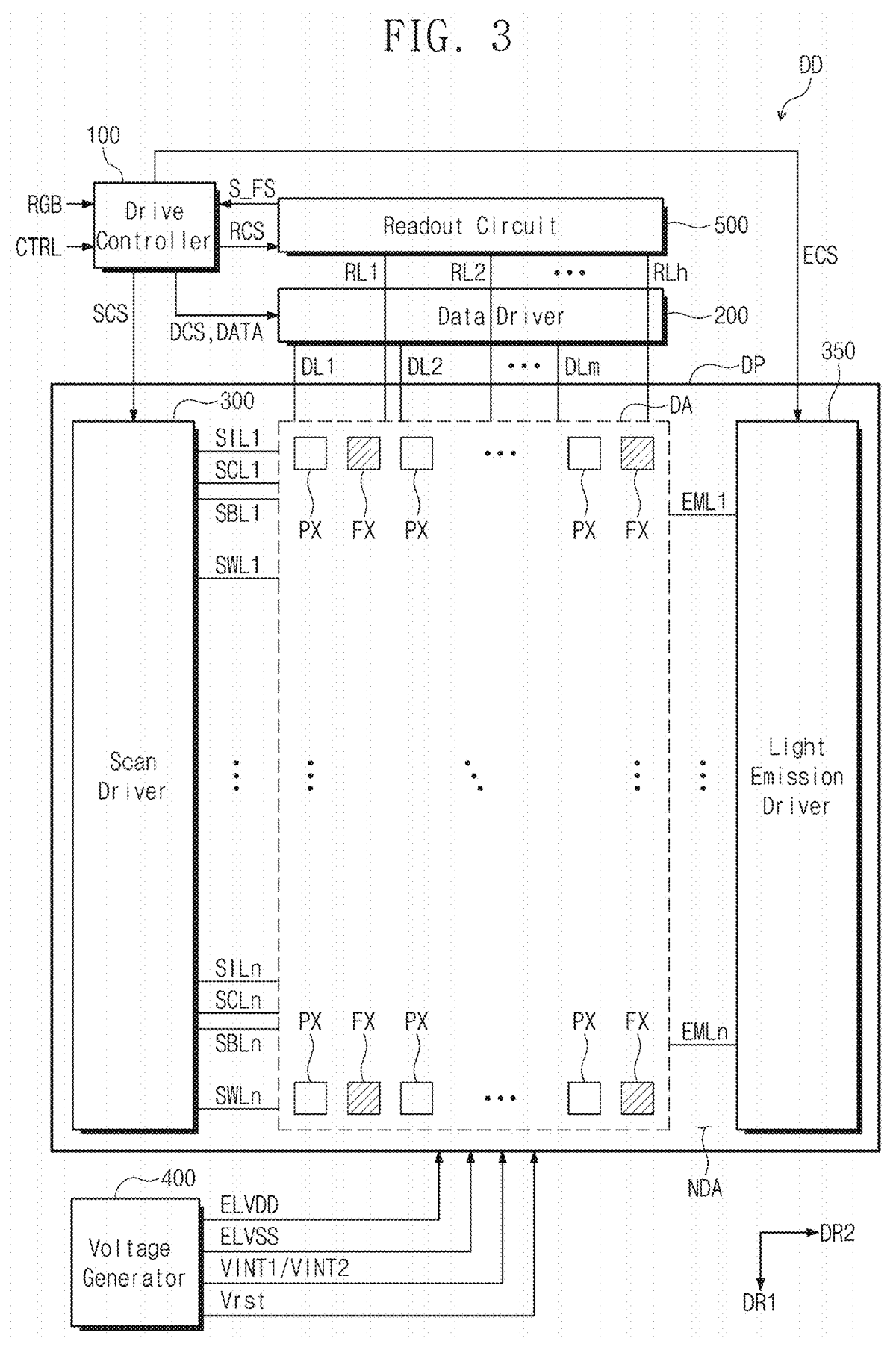

FIG. 3 is a block diagram of the display device according to an embodiment of the present disclosure.

Referring to FIG. 3, the display device DD includes the display panel DP, a panel driver, and a drive controller 100. In an embodiment of the present disclosure, the panel driver includes a data driver 200, a scan driver 300, a light emission driver 350, a voltage generator 400, and a readout circuit 500.

The drive controller 100 receives an image signal RGB and a control signal CTRL. The drive controller 100 generates an image data signal DATA by converting the data format of the image signal RGB according to the specification of an interface with the data driver 200. The drive controller 100 outputs a first control signal SCS, a second control signal ECS, a third control signal DCS, and a fourth control signal RCS.

The data driver 200 receives the third control signal DCS and the image data signal DATA from the drive controller 100. The data driver 200 converts the image data signal DATA into data signals and outputs the data signals to a plurality of data lines DL1 to DLm to be described below. The data signals are analog voltages corresponding to the gray level value of the image data signal DATA.

The scan driver 300 receives the first control signal SCS from the drive controller 100. The scan driver 300 may output scan signals to scan lines in response to the first control signal SCS.

The voltage generator 400 generates voltages required for operation of the display panel DP. In this embodiment, the voltage generator 400 generates a first drive voltage ELVDD, a second drive voltage ELVSS, a first initialization voltage VINT1, and a second initialization voltage VINT2.

The display panel DP may include a display area DA corresponding to the transmissive area TA (illustrated in FIG. 1) and a non-display area NDA corresponding to the bezel area BZA (illustrated in FIG. 1).

The display panel DP may include a plurality of pixels PX disposed in the display area DA and a plurality of sensors FX disposed in the display area DA. In an embodiment of the present disclosure, each of the plurality of sensors FX may be disposed between two pixels PX adjacent to each other. The plurality of pixels PX and the plurality of sensors FX may be alternately disposed in the first and second directions DR1 and DR2. However, the present disclosure is not limited thereto. That is, two or more pixels PX may be disposed between two sensors FX adjacent to each other in the first direction DR1 among the plurality of sensors FX, or two or more pixels PX may be disposed between two sensors FX adjacent to each other in the second direction DR2 among the plurality of sensors FX.

The display panel DP further includes initialization scan lines SIL1 to SILn, compensation scan lines SCL1 to SCLn, write scan lines SWL1 to SWLn, black scan lines SBL1 to SBLn, light emission control lines EML1 to EMLn, the data lines DL1 to DLm, and readout lines RL1 to RLh. The initialization scan lines SIL1 to SILn, the compensation scan lines SCL1 to SCLn, the write scan lines SWL1 to SWLn, the black scan lines SBL1 to SBLn, and the light emission control lines EML1 to EMLn extend in the second direction DR2. The initialization scan lines SIL1 to SILn, the compensation scan lines SCL1 to SCLn, the write scan lines SWL1 to SWLn, the black scan lines SBL1 to SBLn, and the light emission control lines EML1 to EMLn are arranged in the first direction DR1 so as to be spaced apart from each other. The data lines DL1 to DLm and the readout lines RL1 to RLh extend in the first direction DR1 and are arranged in the second direction DR2 so as to be spaced apart from each other.

The plurality of pixels PX are electrically connected to the initialization scan lines SIL1 to SILn, the compensation scan lines SCL1 to SCLn, the write scan lines SWL1 to SWLn, the black scan lines SBL1 to SBLn, the light emission control lines EML1 to EMLn, and the data lines DL1 to DLm, respectively. For example, each of the plurality of pixels PX may be electrically connected to four scan lines.

However, the number of scan lines connected to each pixel PX may be changed without being limited thereto.

The plurality of sensors FX are electrically connected to the write scan lines SWL1 to SWLn and the readout lines RL1 to RLh, respectively. Each of the plurality of sensors FX may be electrically connected to one scan line. However, the present disclosure is not limited thereto. The number of scan lines connected to each sensor FX may be varied. In an embodiment of the present disclosure, the number of readout lines RL1 to RLh may correspond to ½ of the number of data lines DL1 to DLm. However, the present disclosure is not limited thereto. Alternatively, the number of readout lines RL1 to RLh may correspond to ¼ or ⅛ of the number of data lines DL1 to DLm.

The scan driver 300 may be disposed in the non-display area NDA of the display panel DP. The scan driver 300 receives the first control signal SCS from the drive controller 100. In response to the first control signal SCS, the scan driver 300 outputs initialization scan signals to the initialization scan lines SIL1 to SILn and outputs compensation scan signals to the compensation scan lines SCL1 to SCLn. Furthermore, in response to the first control signal SCS, the scan driver 300 may output write scan signals to the write scan lines SWL1 to SWLn and may output black scan signals to the black scan lines SBL1 to SBLn. Alternatively, the scan driver 300 may include first and second scan drivers. The first scan driver may output the initialization scan signals and the compensation scan signals, and the second scan driver may output the write scan signals and the black scan signals.

The light emission driver 350 may be disposed in the non-display area NDA of the display panel DP. The light emission driver 350 receives the second control signal ECS from the drive controller 100. The light emission driver 350 may output light emission control signals to the light emission control lines EML1 to EMLn in response to the second control signal ECS. Alternatively, the scan driver 300 may be connected to the light emission control lines EML1 to EMLn. In this case, the light emission driver 350 may be omitted, and the scan driver 300 may output the light emission control signals to the light emission control lines EML1 to EMLn.

The readout circuit 500 receives the fourth control signal RCS from the drive controller 100. In response to the fourth control signal RCS, the readout circuit 500 may receive sensing signals from the readout lines RL1 to RLh. The readout circuit 500 may process the sensing signals received from the readout lines RL1 to RLh and may provide the processed sensing signals S_FS to the drive controller 100. The drive controller 100 may recognize biometric information based on the processed sensing signals S_FS.

Figure 4A:
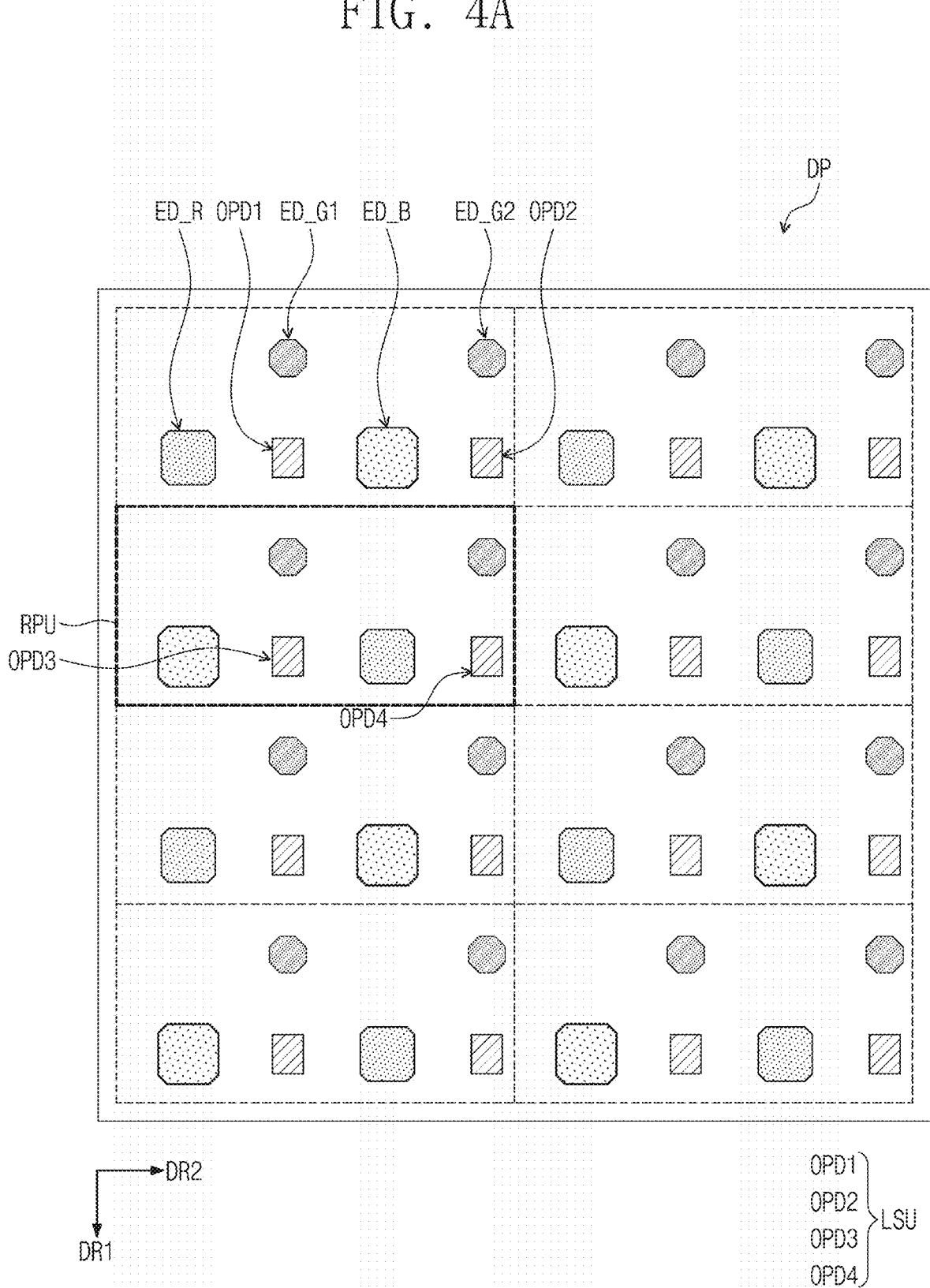
FIG. 4A is an enlarged plan view of a partial area of a display panel according to an embodiment of the present disclosure.
Figure 4B:
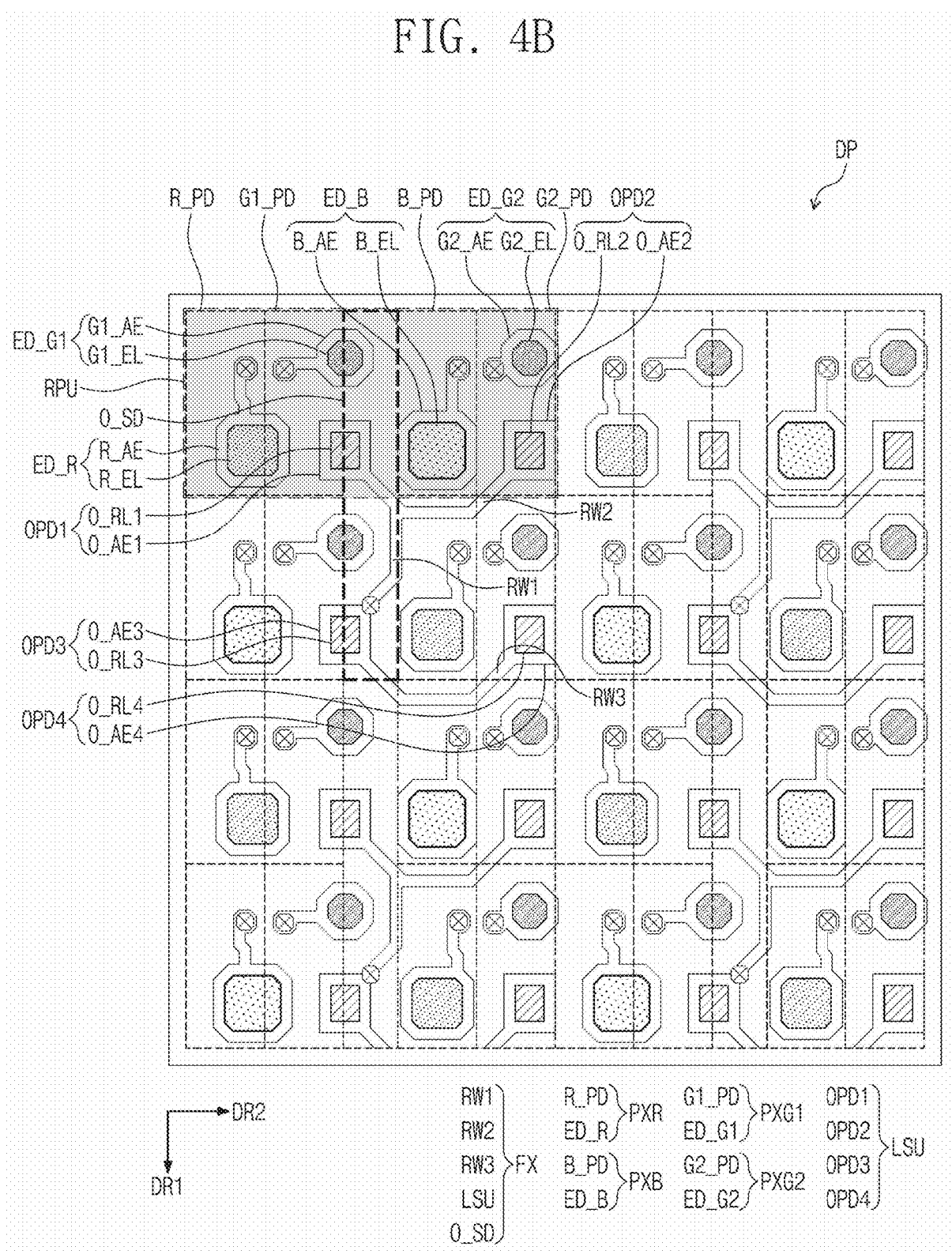
FIG. 4B is a plan view illustrating a connection relationship between a light sensing unit and a sensor drive circuit according to an embodiment of the present disclosure.
Figure 4C:
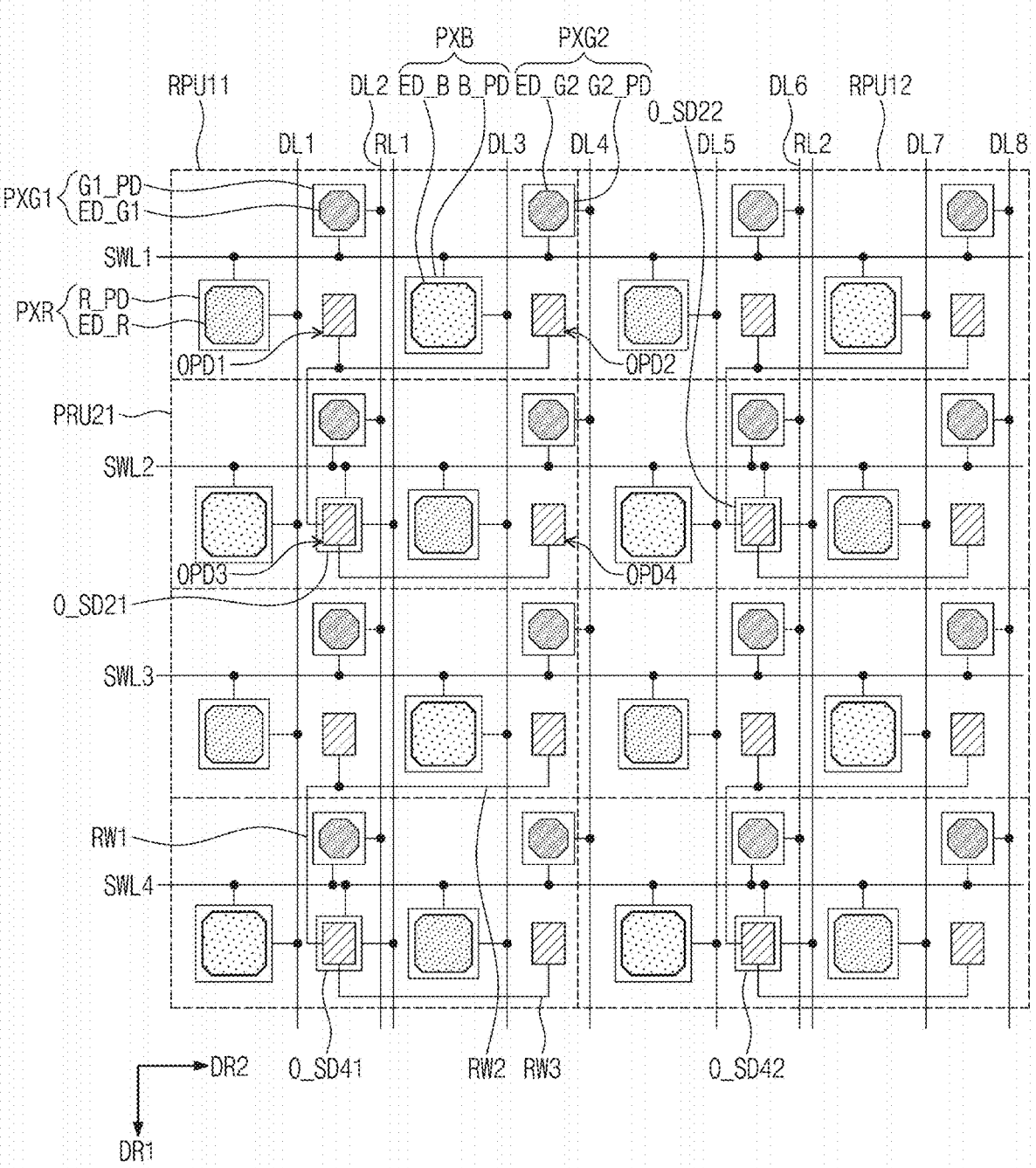
FIG. 4C is a circuit diagram illustrating the connection relationship between the light sensing unit and the sensor drive circuit illustrated in FIG. 4B.
Figure 4D:
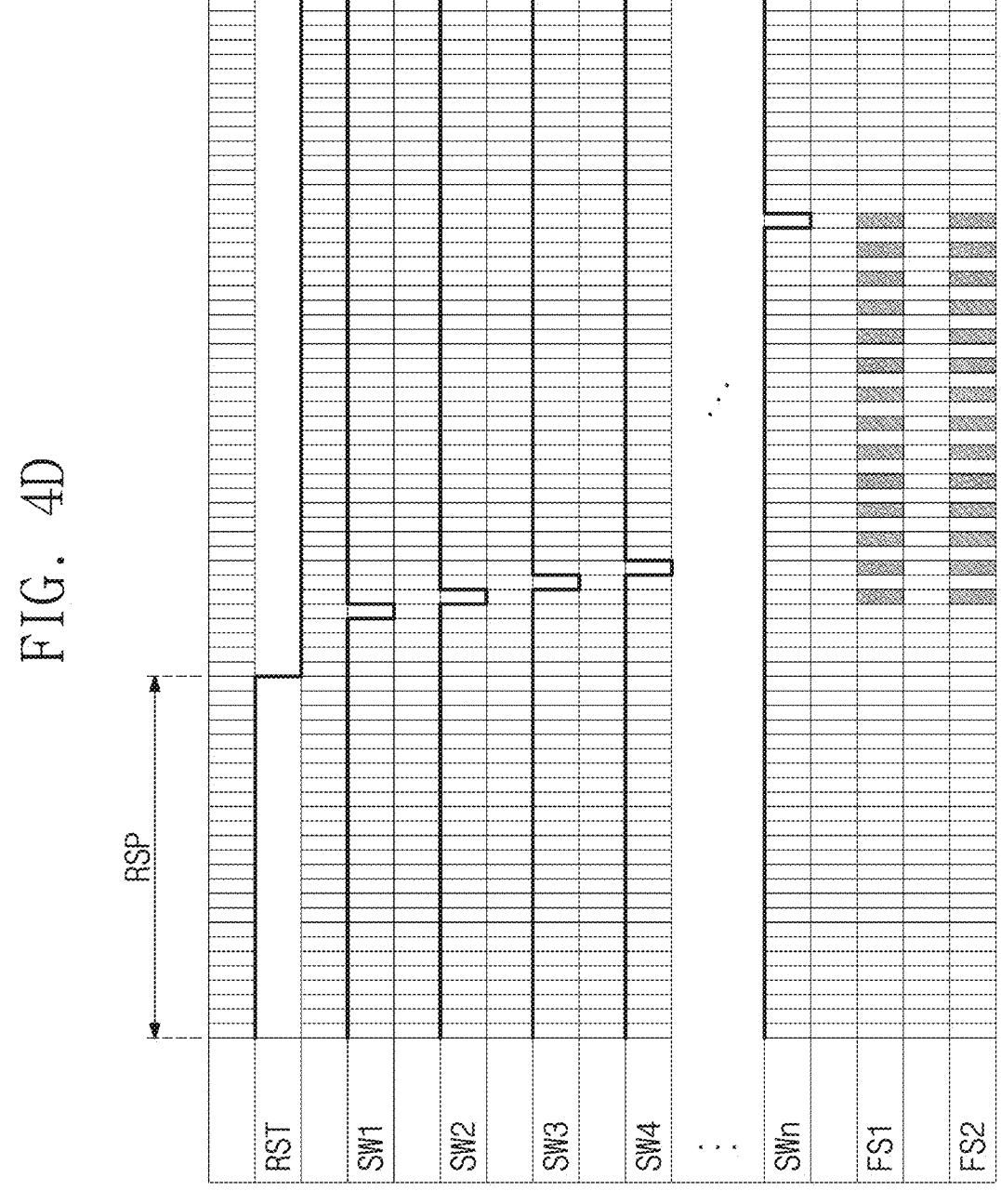
FIG. 4D is a waveform diagram illustrating readout timing of sensors illustrated in FIG. 4C according to an embodiment of the present disclosure.

FIG. 4A is an enlarged plan view of a partial area of the display panel according to an embodiment of the present disclosure. FIG. 4B is a plan view illustrating a connection relationship between a light sensing unit and a sensor drive circuit according to an embodiment of the present disclosure. FIG. 4C is a circuit diagram illustrating the connection relationship between the light sensing unit and the sensor drive circuit illustrated in FIG. 4B. FIG. 4D is a waveform diagram illustrating readout timing of sensors illustrated in FIG. 4C according to an embodiment of the present disclosure.

Referring to FIGS. 4A and 4B, the display panel DP includes a plurality of pixels PXR, PXG1, PXG2, and PXB and a plurality of sensors FX.

The plurality of pixels PXR, PXG1, PXG2, and PXB may be grouped into a plurality of reference pixel units RPU. In an embodiment of the present disclosure, each of the reference pixel units RPU may include four pixels, that is, a first pixel PXR (hereinafter, referred to as a red pixel), two second pixels PXG1 and PXG2 (hereinafter, referred to as first and second green pixels), and a third pixel PXB (hereinafter, referred to as a blue pixel). However, the number of pixels included in each reference pixel unit RPU is not limited thereto. Alternatively, each reference pixel unit RPU may include three pixels, that is, the red pixel PXR, the first green pixel PXG1 (or, the second green pixel PXG2), and the blue pixel PXB.

The red pixel PXR includes a first light emitting element ED_R (hereinafter, referred to as a red light emitting element), the first and second green pixels PXG1 and PXG2 include second light emitting elements ED_G1 and ED_G2 (hereinafter, referred to as first and second green light emitting elements), respectively, and the blue pixel PXB includes a third light emitting element ED_B (hereinafter, referred to as a blue light emitting element). In an embodiment of the present disclosure, the red light emitting element ED_R outputs first color light (e.g., red light), the first and second green light emitting elements ED_G1 and ED_G2 output second color light (e.g., green light), and the blue light emitting element ED_B outputs third color light (e.g., blue light).

The red light emitting elements ED_R and the blue light emitting elements ED_B may be alternately and repeatedly disposed in the first and second directions DR1 and DR2. The first green light emitting elements ED_G1 may be arranged in the first direction DR1, and the second green light emitting elements ED_G2 may be arranged in the first direction DR1. The first green light emitting elements ED_G1 and the second green light emitting elements ED_G2 may be disposed in different columns. The first and second green light emitting elements ED_G1 and ED_G2 may be alternately arranged in the second direction DR2. The first and second green light emitting elements ED_G1 and ED_G2 may be disposed in different rows and columns from the red light emitting elements ED_R and the blue light emitting elements ED_B in the first and second directions DR1 and DR2.

In an embodiment of the present disclosure, the red light emitting element ED_R may have a larger size than the first and second green light emitting elements ED_G1 and ED_G2. Furthermore, the blue light emitting element ED_B may have a size greater than or equal to the size of the red light emitting element ED_R. The sizes of the light emitting elements ED_R, ED_G1, ED_G2, and ED_B are not limited thereto and may be diversely modified. For example, in an embodiment of the present disclosure, the light emitting elements ED_R, ED_G1, ED_G2, and ED_B may have the same size.

The first and second green light emitting elements ED_G1 and ED_G2 may have the same shape as the red and blue light emitting elements ED_R and ED_B. In an embodiment of the present disclosure, each of the red and blue light emitting elements ED_R and ED_B may have an octagonal shape having the same length in the first direction DR1 and the second direction DR2. That is, the red and blue light emitting elements ED_R and ED_B may have the same size. However, the red and blue light emitting elements ED_R and ED_B may have different sizes, but have the same shape.

Each of the first and second green light emitting elements ED_G1 and ED_G2 may have an octagonal shape having the same length in the first direction DR1 and the second direction DR2. In an embodiment of the present disclosure, the first and second green light emitting elements ED_G1 and ED_G2 have the same size and shape. However, the shapes of the light emitting elements ED_R, ED_G1, ED_G2, and ED_B are not limited thereto. The shapes of the light emitting elements ED_R, ED_G1, ED_G2, and ED_B may be diversely modified.

Each of the plurality of sensors FX includes a light sensing unit LSU. The light sensing unit LSU includes at least one light sensing element. FIG. 4A illustrates one example that the light sensing unit LSU that includes four light sensing elements (hereinafter, referred to as first to fourth light sensing elements OPD1, OPD2, OPD3, and OPD4). However, the present disclosure is not limited thereto. For example, the light sensing unit LSU may include two or more light sensing elements.

In an embodiment of the present disclosure, two light sensing elements (e.g., the first and second light sensing elements OPD1 and OPD2 or the third and fourth light sensing elements OPD3 and OPD4) may be disposed to correspond to one reference pixel unit RPU. However, the number of light sensing elements disposed to correspond to each reference pixel unit RPU is not limited thereto. For example, one light sensing element may be disposed to correspond to each reference pixel unit RPU.

Each of the first to fourth light sensing elements OPD1 to OPD4 is disposed between the red and blue light emitting elements ED_R and ED_B in the second direction DR2. Each of the first to fourth light sensing elements OPD1 to OPD4 may be disposed adjacent to the first green light emitting element ED_G1 or the second green light emitting element ED_G2 in the first direction DR1. In an embodiment of the present disclosure, each of the first and third light sensing elements OPD1 and OPD3 is disposed between two first green light emitting elements ED_G1 adjacent to each other in the first direction DR1. Each of the second and fourth light sensing elements OPD2 and OPD4 is disposed between two second green light emitting elements ED_G2 adjacent to each other in the first direction DR1.

The first to fourth light sensing elements OPD1 to OPD4 may have the same size and shape. The first to fourth light sensing elements OPD1 to OPD4 may have a smaller size than the red and blue light emitting elements ED_R and ED_B. In an embodiment of the present disclosure, the first to fourth light sensing elements OPD1 to OPD4 may have a size that is the same as, or similar to, the sizes of the first and second green light emitting elements ED_G1 and ED_G2. However, the sizes of the first to fourth light sensing elements OPD1 to OPD4 are not particularly limited and may be diversely modified. The first to fourth light sensing elements OPD1 to OPD4 may have a different shape from the red and blue light emitting elements ED_R and ED_B. In an embodiment of the present disclosure, the first to fourth light sensing elements OPD1 to OPD4 may have a rectangular shape. The first to fourth light sensing elements OPD1 to OPD4 may have a rectangular shape that is longer in the first direction DR1 than in the second direction DR2. Alternatively, the first to fourth light sensing elements OPD1 to OPD4 may have a square shape having the same length in the first direction DR1 and the second direction DR2.

Referring to FIG. 4B, each reference pixel unit RPU may include the red pixel PXR, the first and second green pixels PXG1 and PXG2, and the blue pixel PXB. The red pixel PXR includes the red light emitting element ED_R and a red pixel drive circuit R_PD, and the blue pixel PXB includes the blue light emitting element ED_B and a blue pixel drive circuit B_PD. The first green pixel PXG1 includes the first green light emitting element ED_G1 and a first green pixel drive circuit G1_PD, and the second green pixel PXG2 includes the second green light emitting element ED_G2 and a second green pixel drive circuit G2_PD.

The red light emitting element ED_R is electrically connected to the red pixel drive circuit R_PD. Specifically, the red light emitting element ED_R includes a red anode electrode R_AE and a red light emitting layer R_EL, and the red anode electrode R_AE is connected to the red pixel drive circuit R_PD through a contact hole. The first green light emitting element ED_G1 is electrically connected to the first green pixel drive circuit G1_PD. Specifically, the first green light emitting element ED_G1 includes a first green anode electrode G1_AE and a first green light emitting layer G1_EL, and the first green anode electrode G1_AE is connected to the first green pixel drive circuit G1_PD through a contact hole. The second green light emitting element ED_G2 is electrically connected to the second green pixel drive circuit G2_PD. Specifically, the second green light emitting element ED_G2 includes a second green anode electrode G2_AE and a second green light emitting layer G2_EL, and the second green anode electrode G2_AE is connected to the second green pixel drive circuit G2_PD through a contact hole. The blue light emitting element ED_B is electrically connected to the blue pixel drive circuit B_PD. Specifically, the blue light emitting element ED_B includes a blue anode electrode B_AE and a blue light emitting layer B_EL, and the blue anode electrode B_AE is connected to the blue pixel drive circuit B_PD through a contact hole.

Each of the sensors FX includes the light sensing unit LSU and a sensor drive circuit O_SD. In an embodiment of the present disclosure, the light sensing unit LSU includes k light sensing elements, and the k light sensing elements is connected to the sensor drive circuit O_SD. Here, k may be a natural number greater than or equal to 2. FIG. 4B illustrates one example that k is 4. When k is 4, the light sensing unit LSU includes the first to fourth light sensing elements OPD1 to OPD4. In an embodiment of the present disclosure, the first to fourth light sensing elements OPD1 to OPD4 may be arranged in a 2×2 matrix form. The first to fourth light sensing elements OPD1 to OPD4 is connected to the sensor drive circuit O_SD. In the first direction DR1, the sensor drive circuit O_SD may be longer than the red and blue pixel drive circuits R_PD and B_PD.

The first light sensing element OPD1 includes a first anode electrode O_AE1 and a first photoelectric conversion layer O_RL1, and the second light sensing element OPD2 includes a second anode electrode O_AE2 and a second photoelectric conversion layer O_RL2. The third light sensing element OPD3 includes a third anode electrode O_AE3 and a third photoelectric conversion layer O_RL3, and the fourth light sensing element OPD4 includes a fourth anode electrode O_AE4 and a fourth photoelectric conversion layer O_RL4. One anode electrode (e.g., the third anode electrode O_AE3) among the first to fourth anode electrodes O_AE1 to O_AE4 is directly connected to the sensor drive circuit O_SD through a contact hole. The sensor drive circuit O_SD may be disposed to overlap two light sensing elements (e.g., the first and third light sensing elements OPD1 and OPD3) among the first to fourth light sensing elements OPD1 to OPD4.

Anode electrodes other than the third anode electrode O_AE3 of the sensors FX may be connected to the sensor drive circuit O_SD through a plurality of routing wires (hereinafter, referred to as first to third routing wires RW1, RW2, and RW3). The first routing wire RW1 electrically connects two light sensing elements (that is, the first and third light sensing elements OPD1 and OPD3) adjacent to each other in the first direction DR1 among the four light sensing elements OPD1, OPD2, OPD3, and OPD4. The second routing wire RW2 electrically connects two light sensing elements (that is, the first and second light sensing elements OPD1 and OPD2) adjacent to each other in the second direction DR2 among the four light sensing elements OPD1, OPD2, OPD3, and OPD4. The third routing wire RW3 electrically connects two light sensing elements (that is, the third and fourth light sensing elements OPD3 and OPD4) adjacent to each other in the second direction DR2 among the four light sensing elements OPD1, OPD2, OPD3, and OPD4.

The first routing wire RW1 is electrically connected to the first anode electrode O_AE1 and the third anode electrode O_AE3, and the second routing wire RW2 is electrically connected to the first anode electrode O_AE1 and the second anode electrode O_AE2. The third routing wire RW3 is electrically connected to the third anode electrode O_AE3 and the fourth anode electrode O_AE4. In an embodiment of the present disclosure, the first to third routing wires RW1 to RW3 may be integrally formed with the first to fourth anode electrodes O_AE1 to O_AE4.

The first to third routing wires RW1, RW2, and RW3 and the first to fourth anode electrodes O_AE1 to O_AE4 may be disposed on the same layer as the anode electrodes R_AE, G1_AE, G2_AE, and B_AE. In this case, the first to third routing wires RW1, RW2, and RW3 and the first to fourth anode electrodes O_AE1 to O_AE4 may contain the same material as the anode electrodes R_AE, G1_AE, G2_AE, and B_AE and may be provided through the same process.

The first to fourth light sensing elements OPD1, OPD2, OPD3, and OPD4 may be connected to the sensor drive circuit O_SD in parallel by the first to third routing wires RW1, RW2, and RW3. Accordingly, the first to fourth light sensing elements OPD1, OPD2, OPD3, and OPD4 may be simultaneously turned on, or may be simultaneously turned off, by the sensor drive circuit O_SD.

The sensor drive circuit O_SD may include a plurality of transistors. In an embodiment of the present disclosure, the sensor drive circuit O_SD and the pixel drive circuits R_PD, G1_PD, G2_PD, and B_PD may be simultaneously formed through the same process. Furthermore, the scan driver 300 (refer to FIG. 3) may include transistors formed through the same process as the sensor drive circuit O_SD and the pixel drive circuits R_PD, G1_PD, G2_PD, and B_PD.

Referring to FIGS. 4B and 4C, the red pixel PXR includes the red light emitting element ED_R and the red pixel drive circuit R_PD, and the blue pixel PXB includes the blue light emitting element ED_B and the blue pixel drive circuit B_PD. The first green pixel PXG1 includes the first green light emitting element ED_G1 and the first green pixel drive circuit G1_PD, and the second green pixel PXG2 includes the second green light emitting element ED_G2 and the second green pixel drive circuit G2_PD.

Four scan lines (e.g., a write scan line, a compensation scan line, an initialization scan line, and a black scan line) are connected to each pixel drive circuit. In FIG. 4C, for convenience of description, only one scan line (e.g., the write scan line) among the four scan lines is illustrated. Four data lines and one readout line may be connected to each reference pixel unit.

In FIG. 4C, four write scan lines SWL1 to SWL4 among the plurality of write scan lines SWL1 to SWLn (refer to FIG. 3), eight data lines DL1 to DL8 among the plurality of data lines DL1 to DLm (refer to FIG. 3), and two readout lines RL1 and RL2 among the plurality of readout lines RL1 to RLh (refer to FIG. 3) are illustrated.

The reference pixel units RPU are disposed in a matrix form. The first write scan line SWL1, the first to fourth data lines DL1 to DL4, and the first readout line RL1 may be connected to a first reference pixel unit RPU11 among the reference pixel units RPU. The first write scan line SWL1, the fifth to eighth data lines DL5 to DL8, and the second readout line RL2 may be connected to a second reference pixel unit RPU12 among the reference pixel units RPU. The second write scan line SWL2, the first to fourth data lines DL1 to DL4, and the first readout line RL1 may be connected to a third reference pixel unit RPU21 among the reference pixel units RPU.

One sensor drive circuit OS_D may be disposed per two reference pixel units RPU. The sensor drive circuits OS_D are arranged in a matrix form. One scan line (e.g., one write scan line) and one readout line may be connected to each of the sensor drive circuits OS_D. The second write scan line SWL2 and the first readout line RL1 are connected to a first sensor drive circuit O_SD21 among the sensor drive circuits, and the second write scan line SWL2 and the second readout line RL2 are connected to a second sensor drive circuit O_SD22. The fourth write scan line SWL4 and the first readout line RL1 are connected to a third sensor drive circuit O_SD41 among the sensor drive circuits, and the fourth write scan line SWL4 and the second readout line RL2 are connected to a fourth sensor drive circuit O_SD42.

The light sensing unit LSU includes the first to fourth light sensing elements OPD1 to OPD4. The sensor drive circuits O_SD21, O_SD22, O_SD41, and O_SD42 are connected to one light sensing element (e.g., the third light sensing element OPD3) among the first to fourth light sensing elements OPD1 to OPD4.

In an embodiment of the present disclosure, the sensor drive circuits O_SD21, O_SD22, O_SD41, and O_SD42 are not electrically connected to odd-numbered write scan lines and are electrically connected to even-numbered write scan lines. The sensor drive circuits O_SD21, O_SD22, O_SD41, and O_SD42 may output sensing signals to the readout lines during activation periods of even-numbered write scan signals applied to the even-numbered write scan lines.

Referring to FIG. 4D, first to fourth write scan signals SW1 to SW4 are supplied to the first to fourth write scan lines SWL1 to SWL4, respectively. The first to fourth write scan signals SW1 to SW4 may be sequentially activated. In an embodiment of the present disclosure, each of the first to fourth write scan signals SW1 to SW4 may have a low level during an activation period.

In the activation periods of the first and third write scan signals SW1 and SW3 among the first to fourth write scan signals SW1 to SW4, the sensor drive circuits O_SD21, O_SD22, O_SD41, and O_SD42 do not output first and second sensing signals FS1 and FS2 to the first and second readout lines RL1 and RL2. In the activation periods of the second and fourth write scan signals SW2 and SW4 among the first to fourth write scan lines SWL1 to SWL4, the sensor drive circuits O_SD21, O_SD22, O_SD41, and O_SD42 may output the first and second sensing signals FS1 and FS2 to the first and second readout lines RL1 and RL2.

By increasing the number of light sensing elements OPD1 to OPD4 by four times the number of sensor drive circuits O_SD as described above, the sensing performance of the display panel DP may be improved.

Figure 5A:
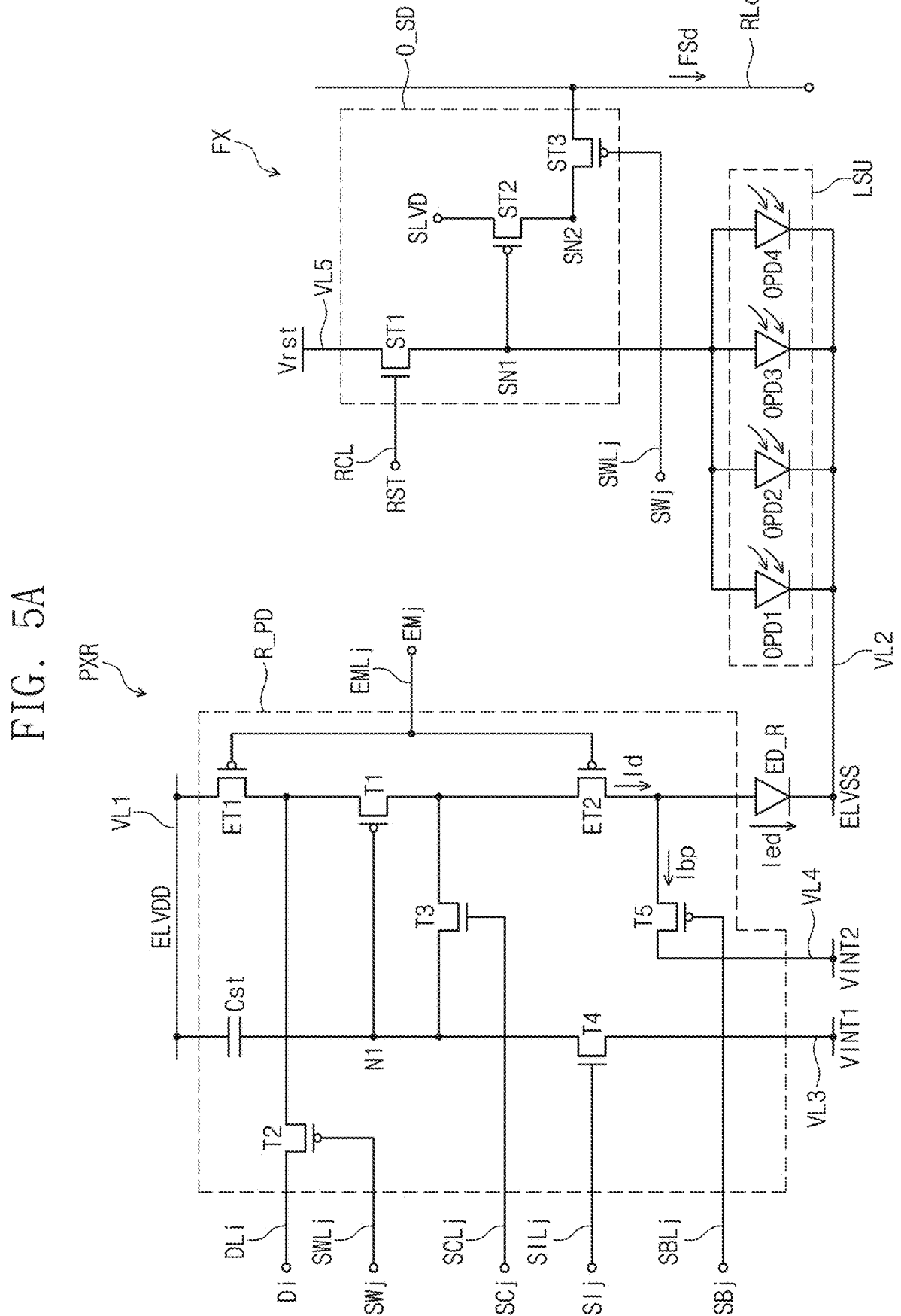
FIG. 5A is a circuit diagram illustrating a pixel and a sensor according to an embodiment of the present disclosure.
Figure 5B:
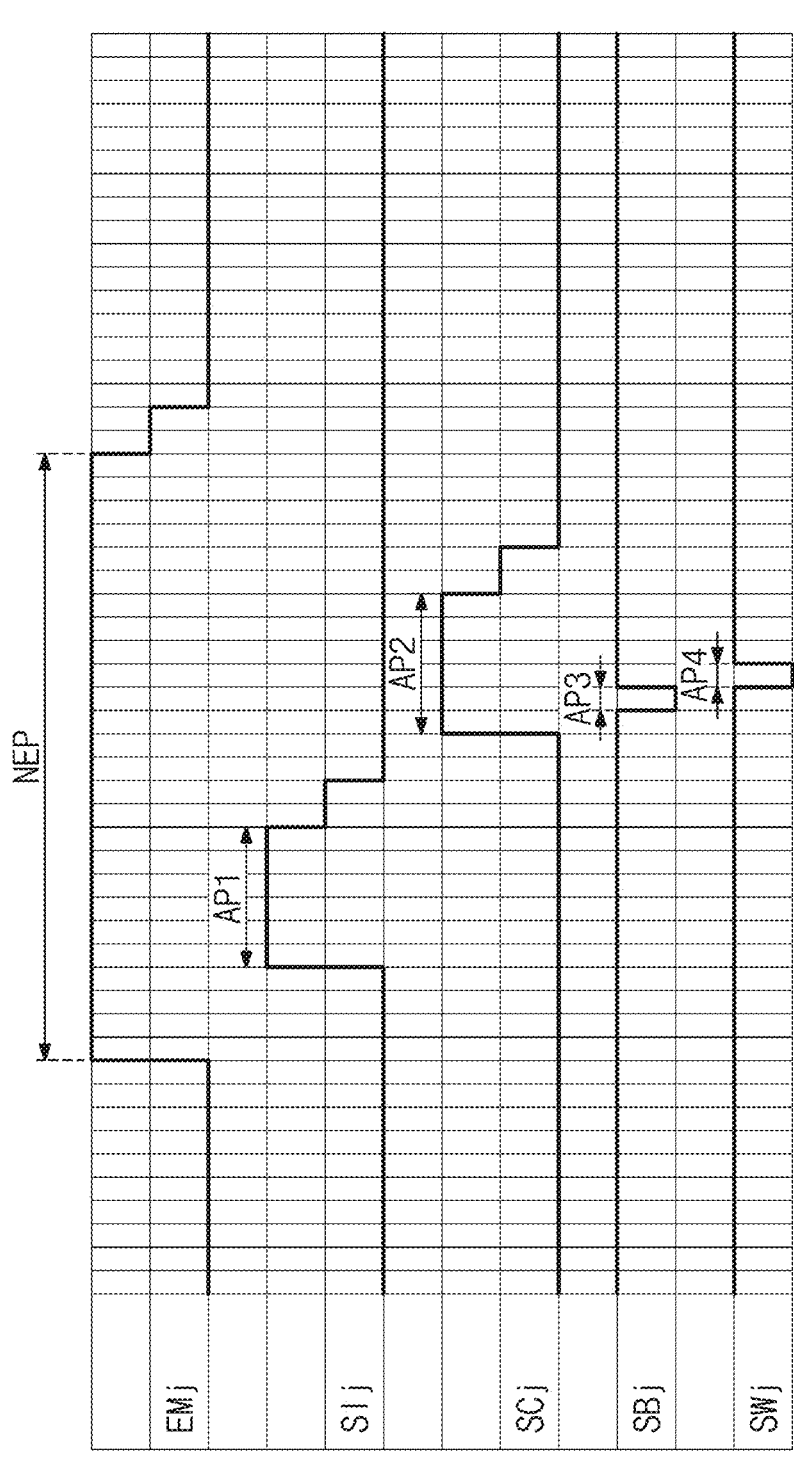
FIG. 5B is a waveform diagram for describing operations of the pixel and the sensor illustrated in FIG. 5A.

FIG. 5A is a circuit diagram illustrating a pixel and a sensor according to an embodiment of the present disclosure. FIG. 5B is a waveform diagram for describing operations of the pixel and the sensor illustrated in FIG. 5A.

FIG. 5A illustrates an equivalent circuit diagram of one pixel (e.g., the red pixel PXR) among the plurality of pixels PX illustrated in FIG. 3. The plurality of pixels PX have the same circuit structure. Therefore, description of the circuit structure of the red pixel PXR may be applied to the remaining pixels, and detailed descriptions of the remaining pixels will be omitted. Furthermore, FIG. 5A illustrates an equivalent circuit diagram of one sensor FX among the plurality of sensors FX illustrated in FIG. 3. The plurality of sensors FX have the same circuit structure. Therefore, description of the circuit structure of the sensor FX may be applied to the remaining sensors, and detailed descriptions of the remaining sensors will be omitted.

Referring to FIG. 5A, the red pixel PXR is connected to the i-th data line DLi among the data lines DL1 to DLm, the j-th initialization scan line SILj among the initialization scan lines SIL1 to SILn, the j-th compensation scan line SCLj among the compensation scan lines SCL1 to SCLn, the j-th write scan line SWLj among the write scan lines SWL1 to SWLn, the j-th black scan line SBLj among the black scan lines SBL1 to SBLn, and the j-th light emission control line EMLj among the light emission control lines EML1 to EMLn.

The red pixel PXR includes the red light emitting element ED_R and the red pixel drive circuit R_PD. The red light emitting element ED_R may be a light emitting diode. In an embodiment of the present disclosure, the red light emitting element ED_R may be an organic light emitting diode including an organic light emitting layer.

The red pixel drive circuit R_PD includes first to fifth transistors T1, T2, T3, T4, and T5, first and second light emission control transistors ET1 and ET2, and one capacitor Cst. At least one of the first to fifth transistors T1, T2, T3, T4, and T5 and the first and second light emission control transistors ET1 and ET2 may be a transistor having a low-temperature polycrystalline silicon (LTPS) semiconductor layer. Some of the first to fifth transistors T1, T2, T3, T4, and T5 and the first and second light emission control transistors ET1 and ET2 may be P-type transistors, and the others may be N-type transistors. For example, the first, second, and fifth transistors T1, T2, and T5 and the first and second light emission control transistors ET1 and ET2 may be PMOS transistors, and the third and fourth transistors T3 and T4 may be NMOS transistors. At least one of the first to fifth transistors T1, T2, T3, T4, and T5 and the first and second light emission control transistors ET1 and ET2 may be a transistor having an oxide semiconductor layer. For example, the third and fourth transistors T3 and T4 may be oxide semiconductor transistors, and the first, second, and fifth transistors T1, T2, and T5 and the first and second light emission control transistors ET1 and ET2 may be LTPS transistors.

The configuration of the red pixel drive circuit R_PD according to the present disclosure is not limited to the embodiment illustrated in FIG. 5A. The red pixel drive circuit R_PD illustrated in FIG. 5A is merely an example, and various changes and modifications can be made to the configuration of the red pixel drive circuit R_PD. For example, the first to fifth transistors T1, T2, T3, T4, and T5 and the first and second light emission control transistors ET1 and ET2 may all be P-type transistors or N-type transistors.

The j-th initialization scan line SILj, the j-th compensation scan line SCLj, the j-th write scan line SWLj, the j-th black scan line SBLj, and the j-th light emission control line EMLj may transfer the j-th initialization scan signal SIj, the j-th compensation scan signal SCj, the j-th write scan signal SWj, the j-th black scan signal SBj, and the j-th light emission control signal EMj to the red pixel PXR, respectively. The i-th data line DLi transfers the i-th data signal Di to the red pixel PXR. The i-th data signal Di may have a voltage level corresponding to the image signal RGB (refer to FIG. 3) that is input to the display device DD (refer to FIG. 3).

A first drive voltage line VL1 and a second drive voltage line VL2 may transfer the first drive voltage ELVDD and the second drive voltage ELVSS to the red pixel PXR, respectively. Furthermore, a first initialization voltage line VL3 and a second initialization voltage line VL4 may transfer the first initialization voltage VINT1 and the second initialization voltage VINT2 to the red pixel PXR, respectively.

The first transistor T1 is connected between the first drive voltage line VL1 receiving the first drive voltage ELVDD and the red light emitting element ED_R. The first transistor T1 includes a first electrode connected with to first drive voltage line VL1 via the first light emission control transistor ET1, a second electrode connected to the red anode electrode R_AE (refer to FIG. 4B) of the red light emitting element ED_R via the second light emission control transistor ET2, and a third electrode connected to one end of the capacitor Cst (e.g., a first node N1). The first transistor T1 may receive the i-th data signal Di that the i-th data line DLi transfers depending on a switching operation of the second transistor T2 and may supply a drive current Id to the red light emitting element ED_R.

The second transistor T2 is connected between the i-th data line DLi and the first electrode of the first transistor T1. The second transistor T2 includes a first electrode connected to the i-th data line DLi, a second electrode connected to the first electrode of the first transistor T1, and a third electrode connected to the j-th write scan line SWLj. The second transistor T2 may be turned on in response to the j-th write scan signal SWj transferred through the j-th write scan line SWLj and may transfer, to the first electrode of the first transistor T1, the i-th data signal Di transferred from the i-th data line DLi.

The third transistor T3 is connected between the second electrode of the first transistor T1 and the first node N1. The third transistor T3 includes a first electrode connected to the third electrode of the first transistor T1, a second electrode connected to the second electrode of the first transistor T1, and a third electrode connected to the j-th compensation scan line SCLj. The third transistor T3 may be turned on in response to the j-th compensation scan signal SCj transferred through the j-th compensation scan line SCLj and may diode-connect the first transistor T1 by connecting the third electrode and the second electrode of the first transistor T1.

The fourth transistor T4 is connected between the first initialization voltage line VL3 through which the first initialization voltage VINT1 is applied and the first node N1. The fourth transistor T4 includes a first electrode connected to the first initialization voltage line VL3 through which the first initialization voltage VINT1 is transferred, a second electrode connected to the first node N1, and a third electrode connected to the j-th initialization scan line SILj. The fourth transistor T4 is turned on in response to the j-th initialization scan signal SIj transferred through the j-th initialization scan line SILj. The turned-on fourth transistor T4 initializes the potential of the third electrode of the first transistor T1 (that is, the potential of the first node N1) by transferring the first initialization voltage VINT1 to the first node N1.

The first light emission control transistor ET1 includes a first electrode connected to the first drive voltage line VL1, a second electrode connected to the first electrode of the first transistor T1, and a third electrode connected to the j-th light emission control line EMLj.

The second light emission control transistor ET2 includes a first electrode connected to the second electrode of the first transistor T1, a second electrode connected to the red anode electrode R_AE of the red light emitting element ED_R (refer to FIGS. 5A and 5B), and a third electrode connected to the j-th light emission control line EMLj.

The first and second light emission control transistors ET1 and ET2 are simultaneously turned on in response to the j-th light emission control signal EMj transferred through the j-th light emission control line EMLj. The first drive voltage ELVDD applied through the turned-on first light emission control transistor ET1 may be compensated for through the diode-connected first transistor T1 and may be transferred to the red light emitting element ED_R.

The fifth transistor T5 includes a first electrode connected to the second initialization voltage line VL4 through which the second initialization voltage VINT2 is transferred, a second electrode connected to the second electrode of the second light emission control transistor ET2, and a third electrode connected to the j-th black scan line SBLj. The second initialization voltage VINT2 may have a voltage level lower than or equal to the voltage level of the first initialization voltage VINT1.

The one end of the capacitor Cst is connected to the third electrode of the first transistor T1 as described above, and an opposite end of the capacitor Cst is connected to the first drive voltage line VL1. A cathode electrode of the red light emitting element ED_R may be connected to the second drive voltage line VL2 that transfers the second drive voltage ELVSS. The second drive voltage ELVSS may have a lower voltage level than the first drive voltage ELVDD. In an embodiment of the present disclosure, the second drive voltage ELVSS may have a lower voltage level than the first and second initialization voltages VINT1 and VINT2.

Referring to FIGS. 5A and 5B, the j-th light emission control signal EMj has a high level during a non-light emission period NEP. Within the non-light emission period NEP, the j-th initialization scan signal SIj is activated. When the j-th initialization scan signal SIj having a high level is provided through the j-th initialization scan line SILj during an activation period AP1 of the j-th initialization scan signal SIj (hereinafter, referred to as a first activation period), the fourth transistor T4 is turned on in response to the j-th initialization scan signal SIj having the high level. The first initialization voltage VINT1 is transferred to the third electrode of the first transistor T1 through the turned-on fourth transistor T4, and the first node N1 is initialized to the first initialization voltage VINT1. Accordingly, the first activation period AP1 may be defined as an initialization period of the red pixel PXR.

Next, the j-th compensation scan signal SCj is activated, and when the j-th compensation scan signal SCj having a high level is supplied through the j-th compensation scan line SCLj during an activation period AP2 of the j-th compensation scan signal SCj (hereinafter, referred to as a second activation period), the third transistor T3 is turned on. The first transistor T1 is diode-connected by the turned-on third transistor T3 and is forward-biased. The first activation period AP1 may not overlap the second activation period AP2.

Within the second activation period AP2, the j-th write scan signal SWj is activated. The j-th write scan signal SWj has a low level during an activation period AP4 (hereinafter, referred to as a fourth activation period). During the fourth activation period AP4, the second transistor T2 is turned on by the j-th write scan signal SWj having the low level. Then, a compensation voltage "Di-Vth" obtained by subtracting a threshold voltage Vth of the first transistor T1 from the i-th data signal Di supplied from the i-th data line DLi is applied to the third electrode of the first transistor T1. That is, the potential of the third electrode of the first transistor T1 may be the compensation voltage "Di-Vth". The fourth activation period AP4 may overlap the second activation period AP2. The duration of the second activation period AP2 may be greater than the duration of the fourth activation period AP4.

The first drive voltage ELVDD and the compensation voltage "Di-Vth" may be applied to the opposite ends of the capacitor Cst, and charges corresponding to the difference between the voltages at the opposite ends of the capacitor Cst may be stored in the capacitor Cst. Here, the period during which the j-th compensation scan signal SCj has the high level may be referred to as a compensation period of the red pixel PXR.

Meanwhile, the j-th black scan signal SBj is activated within the second activation period AP2 of the j-th compensation scan signal SCj. The j-th black scan signal SBj has a low level during an activation period AP3 (hereinafter, referred to as a third activation period). During the third activation period AP3, the fifth transistor T5 is turned on by receiving the j-th black scan signal SBj having the low level through the j-th black scan line SBLj. A portion of the drive current Id may escape through the fifth transistor T5 as a bypass current Ibp. The third activation period AP3 may overlap the second activation period AP2. The duration of the second activation period AP2 may be greater than the duration of the third activation period AP3. The third activation period AP3 may precede the fourth activation period AP4 and may not overlap the fourth activation period AP4.

When the red pixel PXR displays a black image, the red pixel PXR cannot normally display the black image if the red light emitting element ED_R emits light even though the minimum drive current of the first transistor T1 flows as the drive current Id. Accordingly, the fifth transistor T5 in the red pixel PXR according to an embodiment of the present disclosure may distribute a portion of the minimum drive current of the first transistor T1 as the bypass current Ibp to a different current path other than the current path toward the red light emitting element ED_R. Here, the minimum drive current of the first transistor T1 refers to a current flowing to the first transistor T1 under the condition that the gate-source voltage Vgs of the first transistor T1 is lower than the threshold voltage Vth so that the first transistor T1 is turned off. The minimum drive current (e.g., a current of 10 pA or less) flowing to the first transistor T1 under the condition that the first transistor T1 is turned off is transferred to the red light emitting element ED_R, and a black gray-scale image is displayed. When the red pixel PXR displays a black image, an influence of the bypass current Ibp on the minimum drive current is relatively great, whereas when the red pixel PXR displays an image such as a normal image or a white image, the bypass current Ibp has little influence on the drive current Id. Accordingly, when the red pixel PXR displays a black image, a current obtained by subtracting the bypass current Ibp escaping through the fifth transistor T5 from the drive current Id (that is, a light emission current Ied) may be provided to the red light emitting element ED_R so that the black image may be clearly expressed. Thus, the red pixel PXR may implement an accurate black gray-scale image using the fifth transistor T5, and thus the contrast ratio may be improved.

After that, the j-th light emission control signal EMj supplied from the j-th light emission control line EMLj is changed from the high level to a low level. The first and second light emission control transistors ET1 and ET2 are turned on by the light emission control signal EMj having the low level. Then, the drive current Id depending on the difference between the voltage of the third electrode of the first transistor T1 and the first drive voltage ELVDD is generated. The drive current Id is supplied to the red light emitting element ED_R through the second light emission control transistor ET2, and the current Ied flows through the red light emitting element ED_R.

Referring again to FIG. 5A, the sensor FX is connected to the d-th readout line RLd among the readout lines RL1 to RLh, the j-th write scan line SWLj, and a reset control line RCL.

The sensor FX includes the light sensing unit LSU and the sensor drive circuit O_SD. The light sensing unit LSU may include k light sensing elements connected in parallel. When k is 4, four light sensing elements (that is, the first to fourth light sensing elements OPD1 to OPD4) may be connected to the sensor drive circuit O_SD in parallel. Each of the first to fourth light sensing elements OPD1 to OPD4 may be a photo diode. In an embodiment of the present disclosure, each of the first to fourth light sensing elements OPD1 to OPD4 may be an organic photo diode containing an organic material as a photoelectric conversion layer. The first to fourth anode electrodes O_AE1 to O_AE4 of the first to fourth light sensing elements OPD1 to OPD4 (refer to FIG. 4B) may be connected to a first sensing node SN1, and first to fourth cathode electrodes of the first to fourth light sensing elements OPD1 to OPD4 may be connected to the second drive voltage line VL2 that transfers the second drive voltage ELVSS.

The sensor drive circuit O_SD includes three transistors ST1, ST2, and ST3. The three transistors ST1, ST2, and ST3 may include a reset transistor ST1, an amplifying transistor ST2, and an output transistor ST3. At least one of the reset transistor ST1, the amplifying transistor ST2, and the output transistor ST3 may be an oxide semiconductor transistor. In an embodiment of the present disclosure, the reset transistor ST1 may be an oxide semiconductor transistor, and the amplifying transistor ST2 and the output transistor ST3 may be LTPS transistors. However, without being limited thereto, at least the reset transistor ST1 and the output transistor ST3 may be oxide semiconductor transistors, and the amplifying transistor ST2 may be an LTPS transistor.

Furthermore, some of the reset transistor ST1, the amplifying transistor ST2, and the output transistor ST3 may be P-type transistors, and the rest may be an N-type transistor. In an embodiment of the present disclosure, the amplifying transistor ST2 and the output transistor ST3 may be PMOS transistors, and the reset transistor ST1 may be an NMOS transistor. However, without being limited thereto, the reset transistor ST1, the amplifying transistor ST2, and the output transistor ST3 may all be N-type transistors or P-type transistors.

Some of the reset transistor ST1, the amplifying transistor ST2, and the output transistor ST3 (e.g., the reset transistor ST1) may be of the same type as the third and fourth transistors T3 and T4 of the red pixel PXR. The amplifying transistor ST2 and the output transistor ST3 may be transistors of the same type as the first, second, and fifth transistors T1, T2, and T5 and the first and second light emission control transistors ET1 and ET2 of the red pixel PXR.

A circuit configuration of the sensor drive circuit O_SD according to the present disclosure is not limited to that illustrated in FIG. 5A. The sensor drive circuit O_SD illustrated in FIG. 5A is merely illustrative, and various changes and modifications can be made to the configuration of the sensor drive circuit O_SD.

The reset transistor ST1 includes a first electrode that receives a reset voltage Vrst, a second electrode connected to the first sensing node SN1, and a third electrode that receives a reset control signal RST. The reset transistor ST1 may reset the potential of the first sensing node SN1 to the reset signal RST in response to the reset control signal RST. The reset control signal RST may be a signal provided through the reset control line RCL. However, the present disclosure is not limited thereto. Alternatively, the reset control signal RST may be the j-th compensation scan signal SCj supplied through the j-th compensation scan line SCLj. That is, the reset transistor ST1 may receive the j-th compensation scan signal SCj, which is supplied from the j-th compensation scan line SCLj, as the reset control signal RST. In an embodiment of the present disclosure, the reset voltage Vrst may have a lower voltage level than the second drive voltage ELVSS at least during an activation period of the reset control signal RST. The reset voltage Vrst may be a DC voltage maintained at a lower voltage level than the second drive voltage ELVSS.

The reset transistor ST1 may include a plurality of sub-reset transistors connected in series. For example, the reset transistor ST1 may include two sub-reset transistors (hereinafter, referred to as the first and second sub-reset transistors). In this case, a third electrode of the first sub-reset transistor and a third electrode of the second sub-reset transistor are connected to the reset control line RCL. Furthermore, a second electrode of the first sub-reset transistor and a first electrode of the second sub-reset transistor may be electrically connected to each other. In addition, the reset voltage RST may be applied to a first electrode of the first sub-reset transistor, and a second electrode of the second sub-reset transistor may be electrically connected to the first sensing node SN1. However, the number of sub-reset transistors is not limited thereto and may be diversely modified.

The amplifying transistor ST2 includes a first electrode that receives a sensing drive voltage SLVD, a second electrode connected to a second sensing node SN2, and a third electrode connected to the first sensing node SN1. The amplifying transistor ST2 may be turned on depending on the potential of the first sensing node SN1 and may apply the sensing drive voltage SLVD to the second sensing node SN2. In an embodiment of the present disclosure, the sensing drive voltage SLVD may be one of the first drive voltage ELVDD and the first and second initialization voltages VINT1 and VINT2. When the sensing drive voltage SLVD is the first drive voltage ELVDD, the first electrode of the amplifying transistor ST2 may be electrically connected to the first drive voltage line VL1. When the sensing drive voltage SLVD is the first initialization voltage VINT1, the first electrode of the amplifying transistor ST2 may be electrically connected to the first initialization voltage line VL3, and when the sensing drive voltage SLVD is the second initialization voltage VINT2, the first electrode of the amplifying transistor ST2 may be electrically connected to the second initialization voltage line VL4.

The output transistor ST3 includes a first electrode connected to the second sensing node SN2, a second electrode connected to the d-th readout line RLd, and a third electrode that receives an output control signal. The output transistor ST3 may transfer a sensing signal FSd to the d-th readout line RLd in response to the output control signal. The output control signal may be the j-th write scan signal SWj supplied through the j-th write scan line SWLj. That is, the output transistor ST3 may receive the j-th write scan signal SWj which is supplied from the j-th write scan line SWLj as the output control signal.

The light sensing unit LSU of the sensor FX may be exposed to light during light emission periods of the light emitting elements ED_R, ED_G1, ED_G2, and ED_B. The light may be light output from one of the light emitting elements ED_R, ED_G1, ED_G2, and ED_B.

If the user's hand US_F (refer to FIG. 1) touches the display surface, the first to fourth light sensing elements OPD1 to OPD4 may generate photo-charges corresponding to light reflected by ridges of a fingerprint or valleys between the ridges, and the generated photo-charges may be accumulated in the first sensing node SN1.

The amplifying transistor ST2 may be a source follower amplifier that generates a source-drain current in proportion to the amount of charges of the first sensing node SN1 that are input to the third electrode of the amplifying transistor ST2.

During the fourth activation period AP4, the j-th write scan signal SWj having a low level is supplied to the output transistor ST3 through the j-th write scan line SWLj. When the output transistor ST3 is turned on in response to the j-th write scan signal SWj having the low level, the sensing signal FSd corresponding to a current flowing through the amplifying transistor ST2 may be output to the d-th readout line RLd.

Next, when the reset control signal RST having a high level is supplied through the reset control line RCL during the reset period RSP (refer to FIG. 4C), the reset transistor ST1 is turned on. The reset period RSP may be defined as an activation period (e.g., a high level period) of the reset control line RCL. Alternatively, when the reset transistor ST1 is implemented with a PMOS transistor, the reset control signal RST having a low level may be supplied to the reset control line RCL during the reset period RSP. During the reset period RSP, the first sensing node SN1 may be reset to a potential corresponding to the reset voltage Vrst. In an embodiment of the present disclosure, the reset voltage Vrst may have a lower voltage level than the second drive voltage ELVSS.

When the reset period RSP ends, the light sensing unit LSU may generate photo-charges corresponding to the received light, and the generated photo-charges may be accumulated in the first sensing node SN1.

Figure 6A:
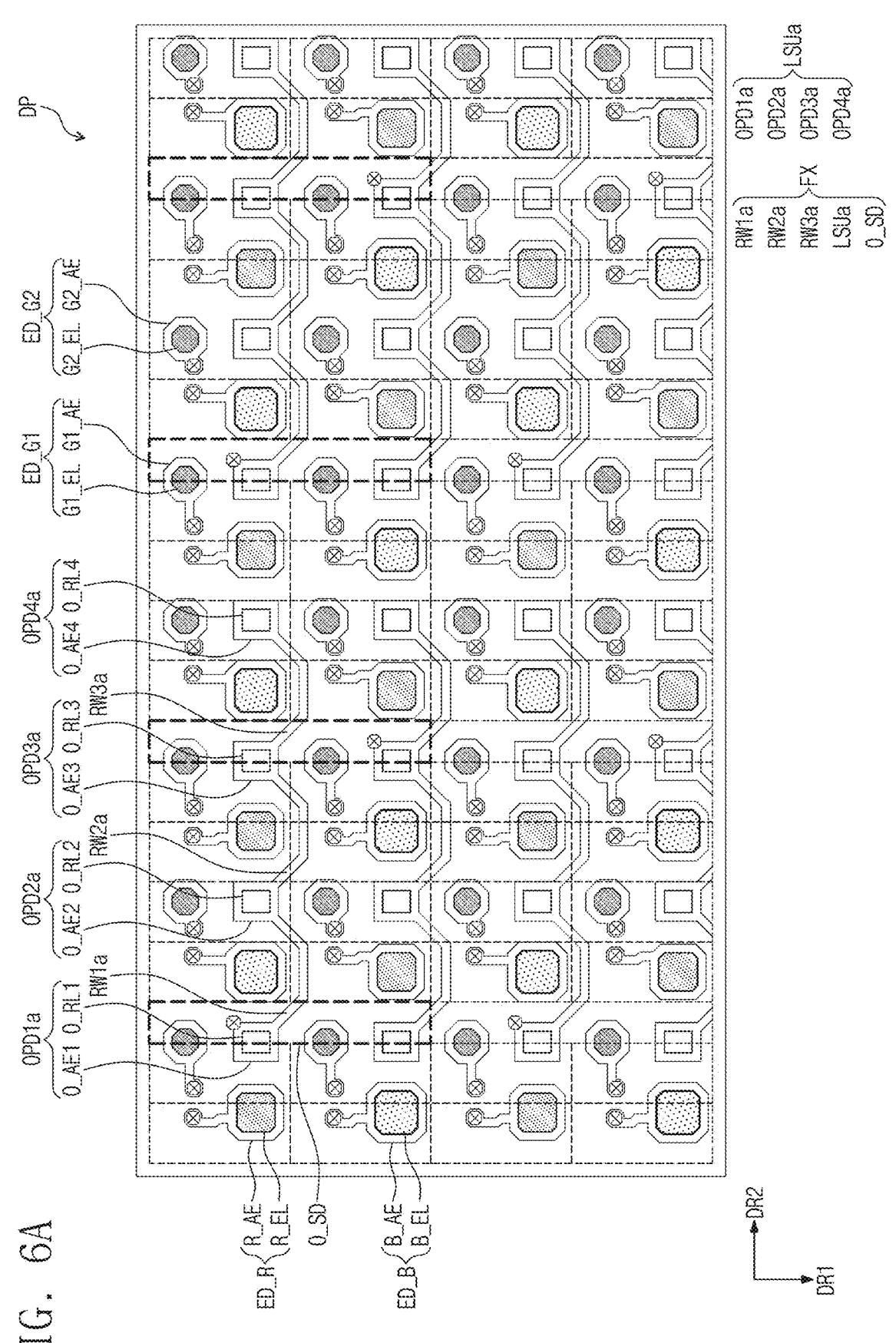
FIG. 6A is a plan view illustrating a connection relationship between a light sensing unit and a sensor drive circuit according to an embodiment of the present disclosure.
Figure 6B:
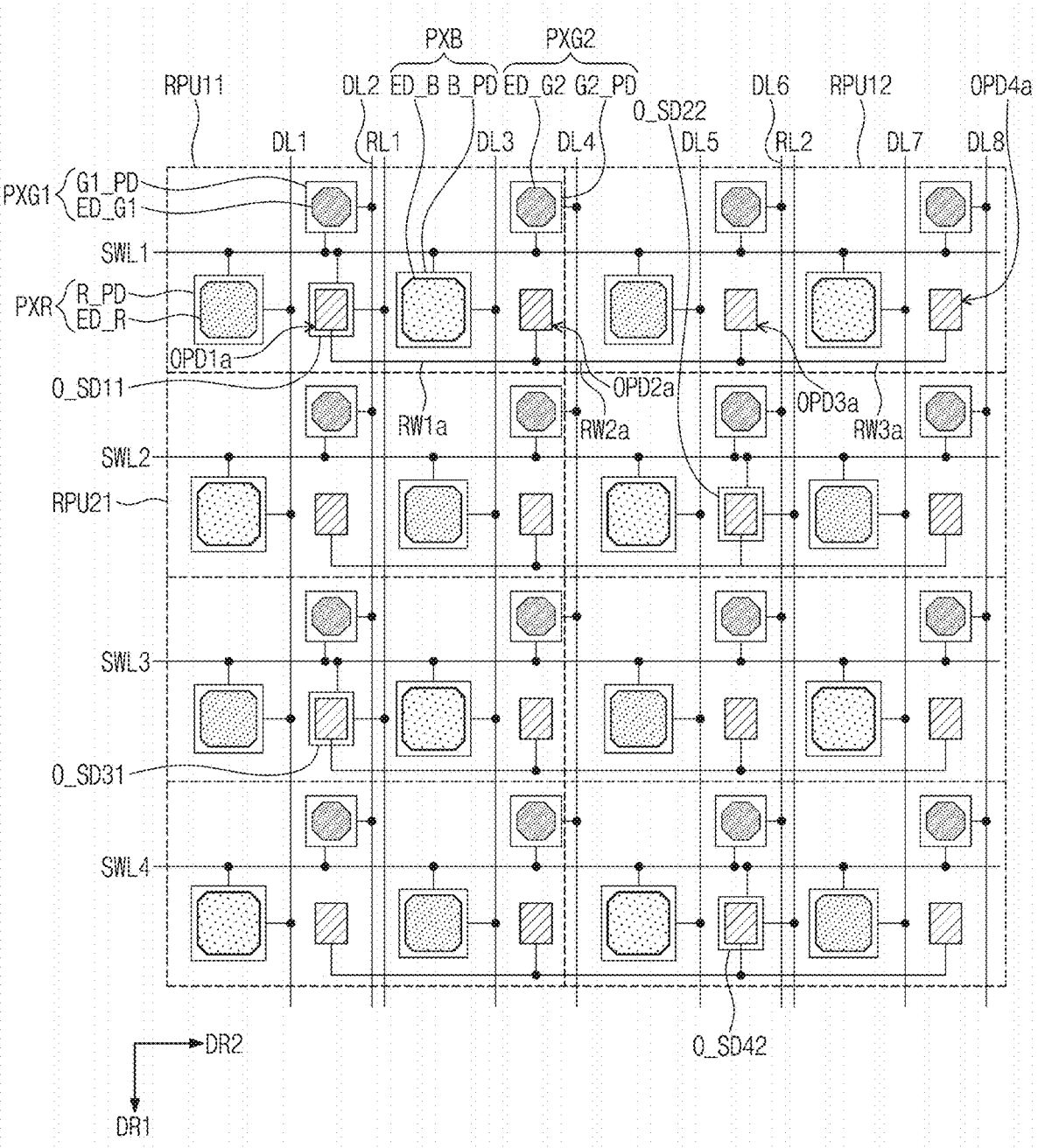
FIG. 6B is a circuit diagram illustrating the connection relationship between the light sensing unit and the sensor drive circuit illustrated in FIG. 6A.
Figure 6C:
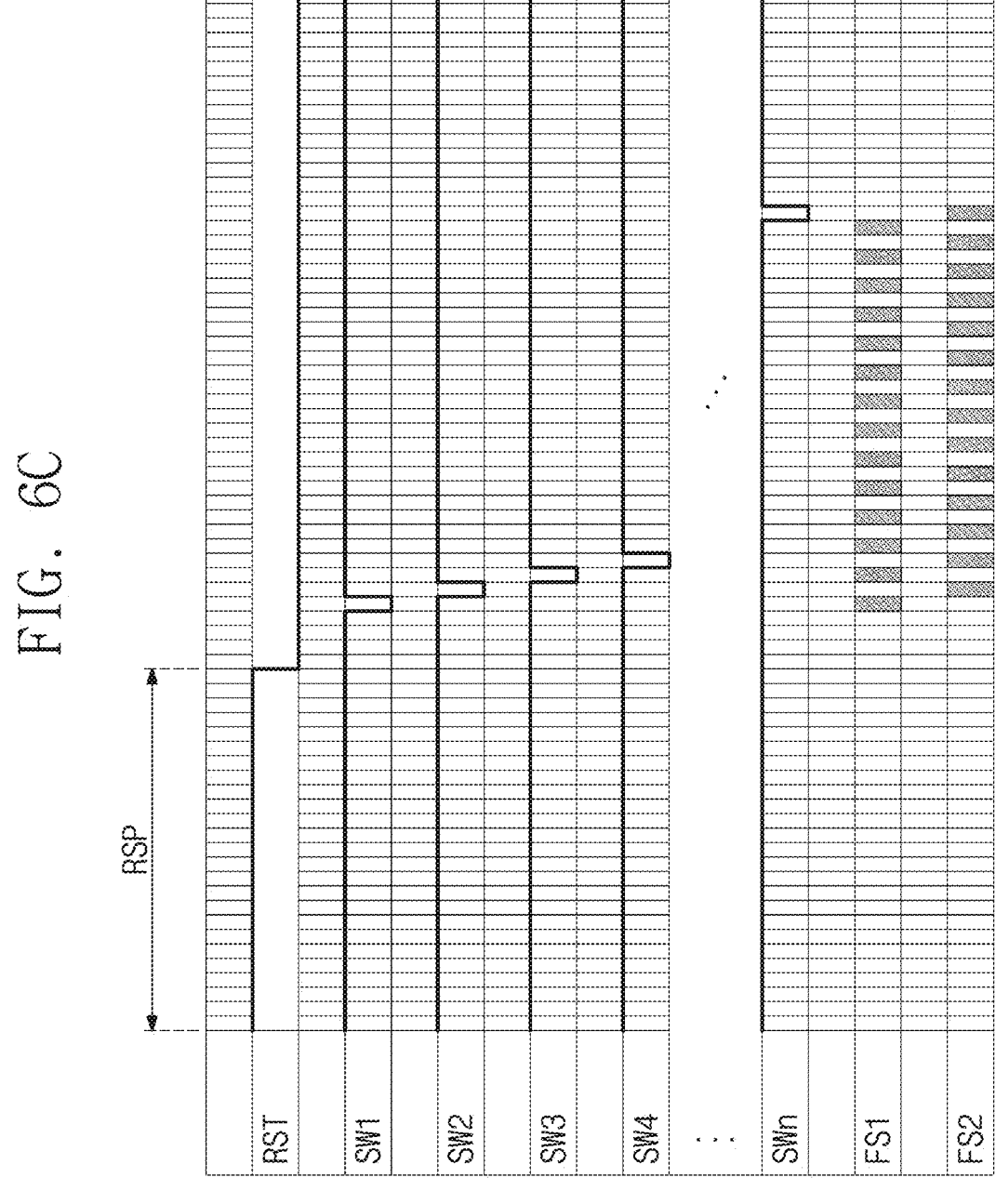
FIG. 6C is a waveform diagram illustrating readout timing of sensors illustrated in FIG. 6B according to an embodiment of the present disclosure.

FIG. 6A is a plan view illustrating a connection relationship between a light sensing unit and a sensor drive circuit according to an embodiment of the present disclosure. FIG. 6B is a circuit diagram illustrating the connection relationship between the light sensing unit and the sensor drive circuit illustrated in FIG. 6A. FIG. 6C is a waveform diagram illustrating readout timing of sensors illustrated in FIG. 6B according to an embodiment of the present disclosure. Among the components illustrated in FIGS. 6A to 6C, components identical to the components illustrated in FIGS. 4B to 4D will be assigned with identical reference numerals, and descriptions thereabout will be omitted.

Referring to FIG. 6A, each of the sensors FX includes a light sensing unit LSUa and a sensor drive circuit O_SD. In an embodiment of the present disclosure, the light sensing unit LSUa includes k light sensing elements, and one of the k light sensing elements is connected to the sensor drive circuit O_SD. FIG. 6A illustrates one example that k is 4. When k is 4, the light sensing unit LSUa includes first to fourth light sensing elements OPD1a to OPD4a. One light sensing element (e.g., the first or third light sensing element OPD1a or OPD3a) among the first to fourth light sensing elements OPD1a to OPD4a is connected to the sensor drive circuit O_SD. In an embodiment of the present disclosure, the first to fourth light sensing elements OPD1a to OPD4a may be arranged in the second direction DR2. The first to fourth light sensing elements OPD1a to OPD4a may be arranged in a 1×4 matrix form. Furthermore, the light sensing units LSUa may be arranged and disposed in the first and second directions DR1 and DR2.

The first light sensing element OPD1a includes a first anode electrode O_AE1 and a first photoelectric conversion layer O_RL1, and the second light sensing element OPD2a includes a second anode electrode O_AE2 and a second photoelectric conversion layer O_RL2. The third light sensing element OPD3a includes a third anode electrode O_AE3 and a third photoelectric conversion layer O_RL3, and the fourth light sensing element OPD4a includes a fourth anode electrode O_AE4 and a fourth photoelectric conversion layer O_RL4. One anode electrode (e.g., the first anode electrode O_AE1 or the third anode electrode O_AE3) among the first to fourth anode electrodes O_AE1 to O_AE4 is directly connected to the sensor drive circuit O_SD through a contact hole.

In an embodiment of the present disclosure, among the light sensing units LSUa, light sensing units disposed in odd-numbered rows have a structure in which the first light sensing element OPD1a among the first to fourth light sensing elements OPD1a to OPD4a is connected to a corresponding sensor drive circuit O_SD. Among the light sensing units LSUa, light sensing units disposed in even-numbered rows have a structure in which the third light sensing element OPD3a among the first to fourth light sensing elements OPD1a to OPD4a is connected to a corresponding sensor drive circuit O_SD. However, the present disclosure is not limited thereto. Alternatively, in an embodiment of the present disclosure, among the light sensing units LSUa, the light sensing units disposed in the even-numbered rows may have a structure in which the first light sensing element OPD1a among the first to fourth light sensing elements OPD1a to OPD4a is connected to a corresponding sensor drive circuit O_SD. Furthermore, among the light sensing units LSUa, the light sensing units disposed in the odd-numbered rows may have a structure in which the third light sensing element OPD3a among the first to fourth light sensing elements OPD1a to OPD4a is connected to a corresponding sensor drive circuit O_SD.

Each of the sensors FX may further include a plurality of routing wires (hereinafter, referred to as first to third routing wires RW1a, RW2a, and RW3a) that electrically connect the first to fourth light sensing elements OPD1a to OPD4a. The first routing wire RW1a electrically connects two light sensing elements (that is, the first and second light sensing elements OPD1a and OPD2a) adjacent to each other in the second direction DR2 among the first to fourth light sensing elements OPD1a to OPD4a. The second routing wire RW2a electrically connects two light sensing elements (that is, the second and third light sensing elements OPD2a and OPD3a) adjacent to each other in the second direction DR2 among the first to fourth light sensing elements OPD1a to OPD4a. The third routing wire RW3a electrically connects two light sensing elements (that is, the third and fourth light sensing elements OPD3a and OPD4a) adjacent to each other in the second direction DR2 among the first to fourth light sensing elements OPD1a to OPD4a.

The first routing wire RW1a is electrically connected to the first anode electrode O_AE1 and the second anode electrode O_AE2, and the second routing wire RW2a is electrically connected to the second anode electrode O_AE2 and the third anode electrode O_AE3. The third routing wire RW3a is electrically connected to the third anode electrode O_AE3 and the fourth anode electrode O_AE4. In an embodiment of the present disclosure, the first to third routing wires RW1a to RW3a may be integrally formed with the first to fourth anode electrodes O_AE1 to O_AE4.

The first to third routing wires RW1a, RW2a, and RW3a and the first to fourth anode electrodes O_AE1 to O_AE4 may be disposed on the same layer as anode electrodes R_AE, G1_AE, G2_AE, and B_AE. In this case, the first to third routing wires RW1a, RW2a, and RW3a and the first to fourth anode electrodes O_AE1 to O_AE4 may contain the same material as the anode electrodes R_AE, G1_AE, G2_AE, and B_AE and may be provided through the same process.

One sensor drive circuit O_SD may be disposed per two reference pixel units. The sensor drive circuits O_SD are arranged in a matrix form in the first and second directions DR1 and DR2.

Referring to FIG. 6B, one scan line (e.g., one write scan line) and one readout line may be connected to each of the sensor drive circuits. For example, a first write scan line SWL1 and a first readout line RL1 are connected to a first sensor drive circuit O_SD11 among the sensor drive circuits, and a second write scan line SWL2 and a second readout line RL2 are connected to a second sensor drive circuit O_SD22. A third write scan line SWL3 and the first readout line RL1 are connected to a third sensor drive circuit O_SD31 among the sensor drive circuits, and a fourth write scan line SWL4 and the second readout line RL2 are connected to a fourth sensor drive circuit O_SD42.

The light sensing unit LSUa includes the first to fourth light sensing elements OPD1a to OPD4a. The first and third sensor drive circuits O_SD11 and O_SD31 are connected to one light sensing element (e.g., the first light sensing element OPD1a) among the first to fourth light sensing elements OPD1a to OPD4a, and the second and fourth sensor drive circuits O_SD22 and O_SD42 are connected to one light sensing element (e.g., the third light sensing element OPD3a) among the first to fourth light sensing elements OPD1a to OPD4a.

Referring to FIGS. 6B and 6C, the first and third sensor drive circuits O_SD11 and O_SD31 are electrically connected to the odd-numbered write scan lines SWL1 and SWL3 and are not electrically connected to the even-numbered write scan lines SWL2 and SWL4. The first and third sensor drive circuits O_SD11 and O_SD31 may output a first sensing signal FS1 to the first readout line RL1 during activations periods of odd-numbered write scan signals SW1 and SW3 applied to the odd-numbered write scan lines SWL1 and SWL3.

Meanwhile, the second and fourth sensor drive circuits O_SD22 and O_SD42 are electrically connected to the even-numbered write scan lines SWL2 and SWL4 and are not electrically connected to the odd-numbered write scan lines SWL1 and SWL3. The second and fourth sensor drive circuits O_SD22 and O_SD42 may output a second sensing signal FS2 to the second readout line RL2 during activations periods of even-numbered write scan signals SW2 and SW4 applied to the even-numbered write scan lines SWL2 and SWL4.

By increasing the number of light sensing elements OPD1a to OPD4a by four times the number of sensor drive circuits O_SD as described above, the amount of light received by the display panel DP may be increased, and thus the sensing performance may be improved.

Figure 7A:
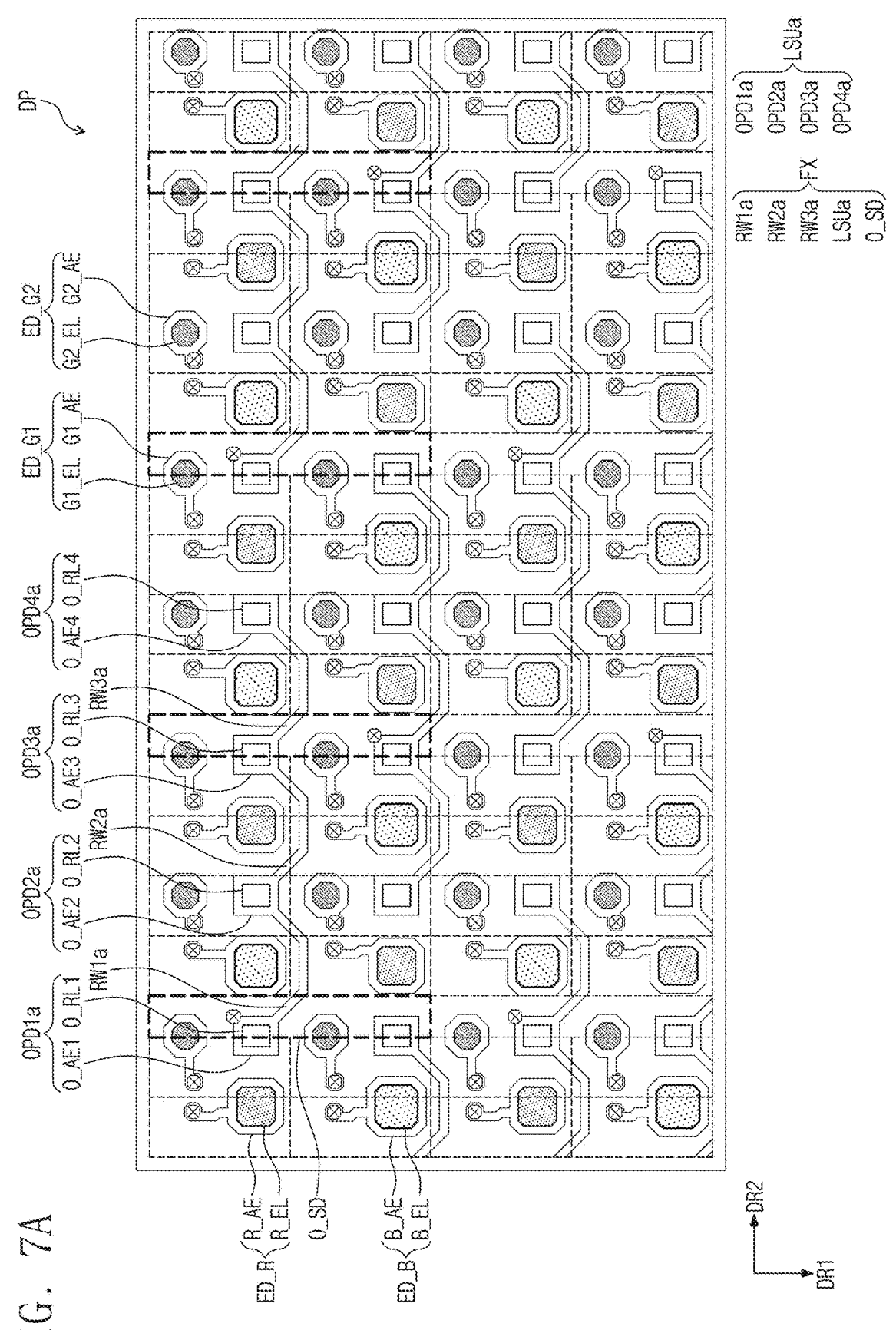
FIG. 7A is a plan view illustrating a connection relationship between a light sensing unit and a sensor drive circuit according to an embodiment of the present disclosure.
Figure 7B:
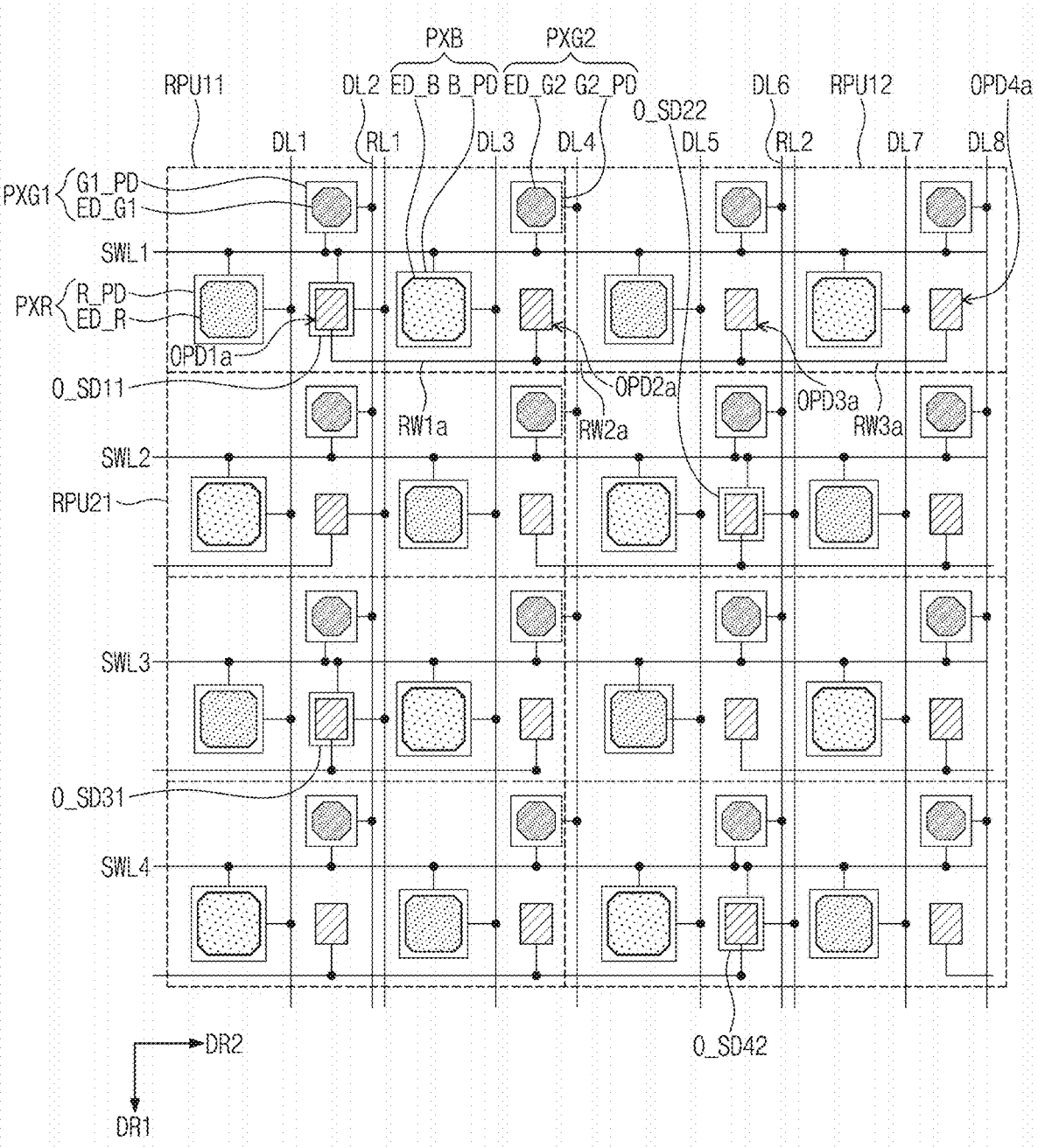
FIG. 7B is a circuit diagram illustrating the connection relationship between the light sensing unit and the sensor drive circuit illustrated in FIG. 7A.

FIG. 7A is a plan view illustrating a connection relationship between a light sensing unit and a sensor drive circuit according to an embodiment of the present disclosure. FIG. 7B is a circuit diagram illustrating the connection relationship between the light sensing unit and the sensor drive circuit illustrated in FIG. 7A. Among the components illustrated in FIGS. 7A and 7B, components identical to the components illustrated in FIGS. 6A and 6B will be assigned with identical reference numerals, and detailed descriptions thereabout will be omitted In FIG. 6A, the light sensing units LSUa are arranged along the first direction DR1. In FIG. 7A, light sensing units LSUa may be arranged along the first direction DR1 while being shifted in the second direction DR2.

FIG. 7A illustrates one example that the light sensing units LSUa disposed adjacent to each other along the first direction are shifted by a distance between adjacent light sensing elements in the second direction DR2. However, the present disclosure is not limited thereto. For example, the light sensing units LSUa disposed adjacent to each other along the first direction may be shifted by twice the distance between adjacent light sensing elements in the second direction DR2.

Each light sensing units LSUa include four light sensing elements OPD1a to OPD4a disposed in the first row. The four light sensing elements OPD1a to OPD4a disposed in the first row are connected to a same sensor drive circuits O_SD. A light sensing element OPD1a disposed in a left most portion of the four light sensing elements OPD1a to OPD4a may be directly connected to a corresponding sensor drive circuit O_SD. Light sensing units disposed in the second row among the light sensing units LSUa may be shifted by the distance between adjacent light sensing elements in the second direction DR2 from the light sensing unit LSUa dispose in the first row. The four light sensing elements OPD1a to OPD4a disposed in the second row are connected to a same sensor drive circuits O_SD. A light sensing element OPD2a disposed in a second left portion of the four light sensing elements OPD1a to OPD4a in the second row may be directly connected to a corresponding sensor drive circuit O_SD. Light sensing units disposed in the third row among the light sensing units LSUa may be shifted by the distance between adjacent light sensing elements in the second direction DR2 from the light sensing unit disposed in the second row. The four light sensing elements OPD1a to OPD4a disposed in the third row are connected to a same sensor drive circuits O_SD. A light sensing element OPD3a disposed in a third left portion of the four light sensing elements OPD1a to OPD4a in the third row may be directly connected to a corresponding sensor drive circuit O_SD. Light sensing units disposed in the fourth row among the light sensing units LSUa may be shifted by the distance between adjacent light sensing elements in the second direction DR2 from the light sensing unit disposed in the third row. The four light sensing elements OPD1a to OPD4a disposed in the fourth row are connected to a same sensor drive circuits O_SD. A light sensing element OPD4a disposed in a right most portion of the four light sensing elements OPD1a to OPD4a in the fourth row may be directly connected to a corresponding sensor drive circuit O_SD.

By arranging the light sensing units LSUa in different rows not to be aligned along a straight line extending in the first direction DR1, the sensing sensitivity may be further improved while the amount of received light remains the same as that of the display panel DP of FIG. 6A.

One sensor drive circuit O_SD may be disposed per two reference pixel units. The sensor drive circuits O_SD are arranged in a matrix form.

Referring to FIG. 7B, one scan line (e.g., one write scan line) and one readout line may be connected to each of the sensor drive circuits. A first write scan line SWL1 and a first readout line RL1 are connected to a first sensor drive circuit O_SD11 among the sensor drive circuits, and a second write scan line SWL2 and a second readout line RL2 are connected to a second sensor drive circuit O_SD22. A third write scan line SWL3 and the first readout line RL1 are connected to a third sensor drive circuit O_SD31 among the sensor drive circuits, and a fourth write scan line SWL4 and the second readout line RL2 are connected to a fourth sensor drive circuit O_SD42.

The light sensing unit LSUa includes the first to fourth light sensing elements OPD1a to OPD4a. The first and third sensor drive circuits O_SD11 and O_SD31 are directly connected to one light sensing element (e.g., the first light sensing element OPD1a) among the first to fourth light sensing elements OPD1a to OPD4a, and the second and fourth sensor drive circuits O_SD22 and O_SD42 are directly connected to one light sensing element (e.g., the third light sensing element OPD3a) among the first to fourth light sensing elements OPD1a to OPD4a.

Referring to FIGS. 7B and 6C, the first and third sensor drive circuits O_SD11 and O_SD31 are electrically connected to the odd-numbered write scan lines SWL1 and SWL3 and are not electrically connected to the even-numbered write scan lines SWL2 and SWL4. The first and third sensor drive circuits O_SD11 and O_SD31 may output a first sensing signal FS1 to the first readout line RL1 during activations periods of odd-numbered write scan signals SW1 and SW3 applied to the odd-numbered write scan lines SWL1 and SWL3.

Meanwhile, the second and fourth sensor drive circuits O_SD22 and O_SD42 are electrically connected to the even-numbered write scan lines SWL2 and SWL4 and are not electrically connected to the odd-numbered write scan lines SWL1 and SWL3. The second and fourth sensor drive circuits O_SD22 and O_SD42 may output a second sensing signal FS2 to the second readout line RL2 during activations periods of even-numbered write scan signals SW2 and SW4 applied to the even-numbered write scan lines SWL2 and SWL4.

Figure 8A:
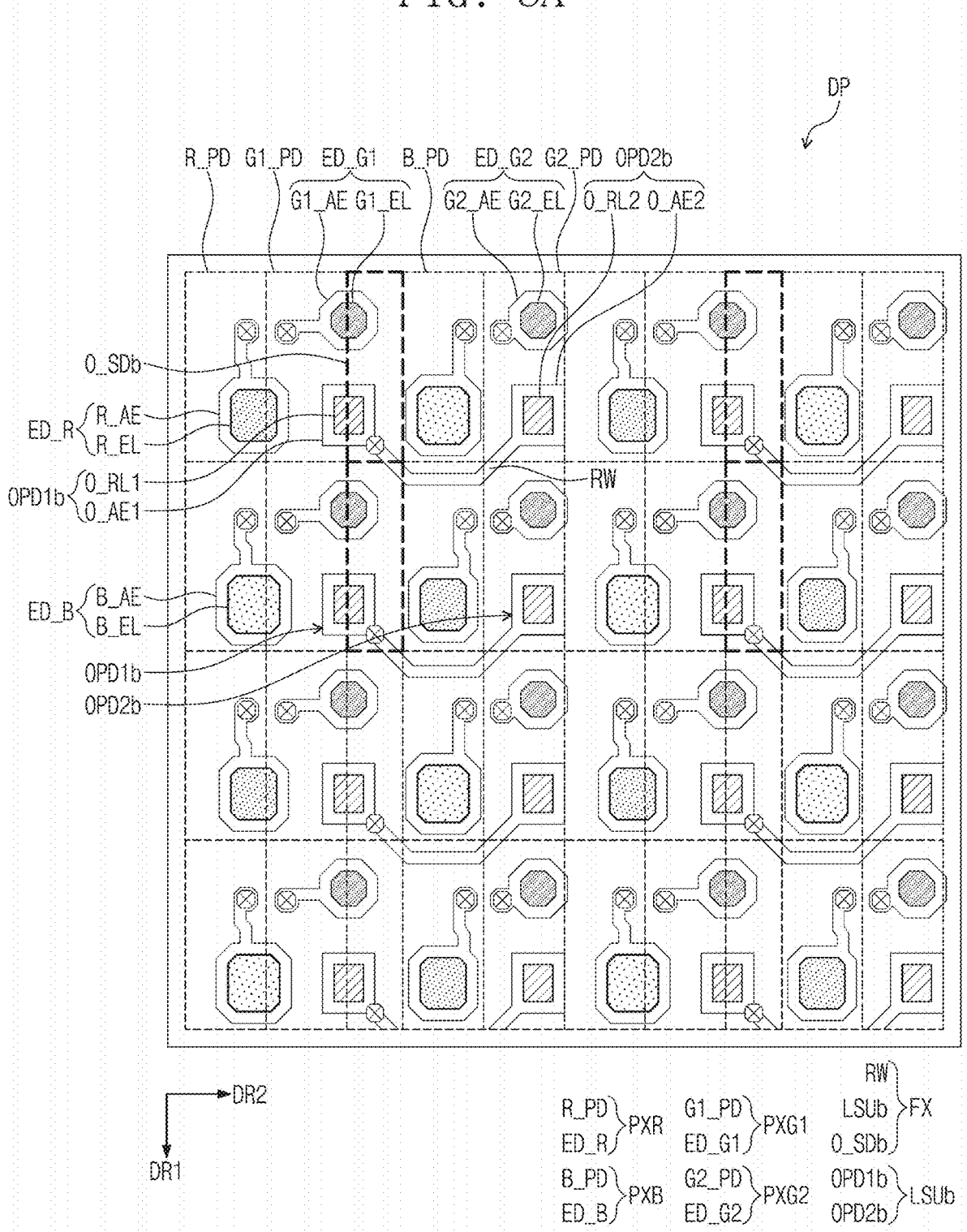
FIG. 8A is a plan view illustrating a connection relationship between a light sensing unit and a sensor drive circuit according to an embodiment of the present disclosure.
Figure 8B:
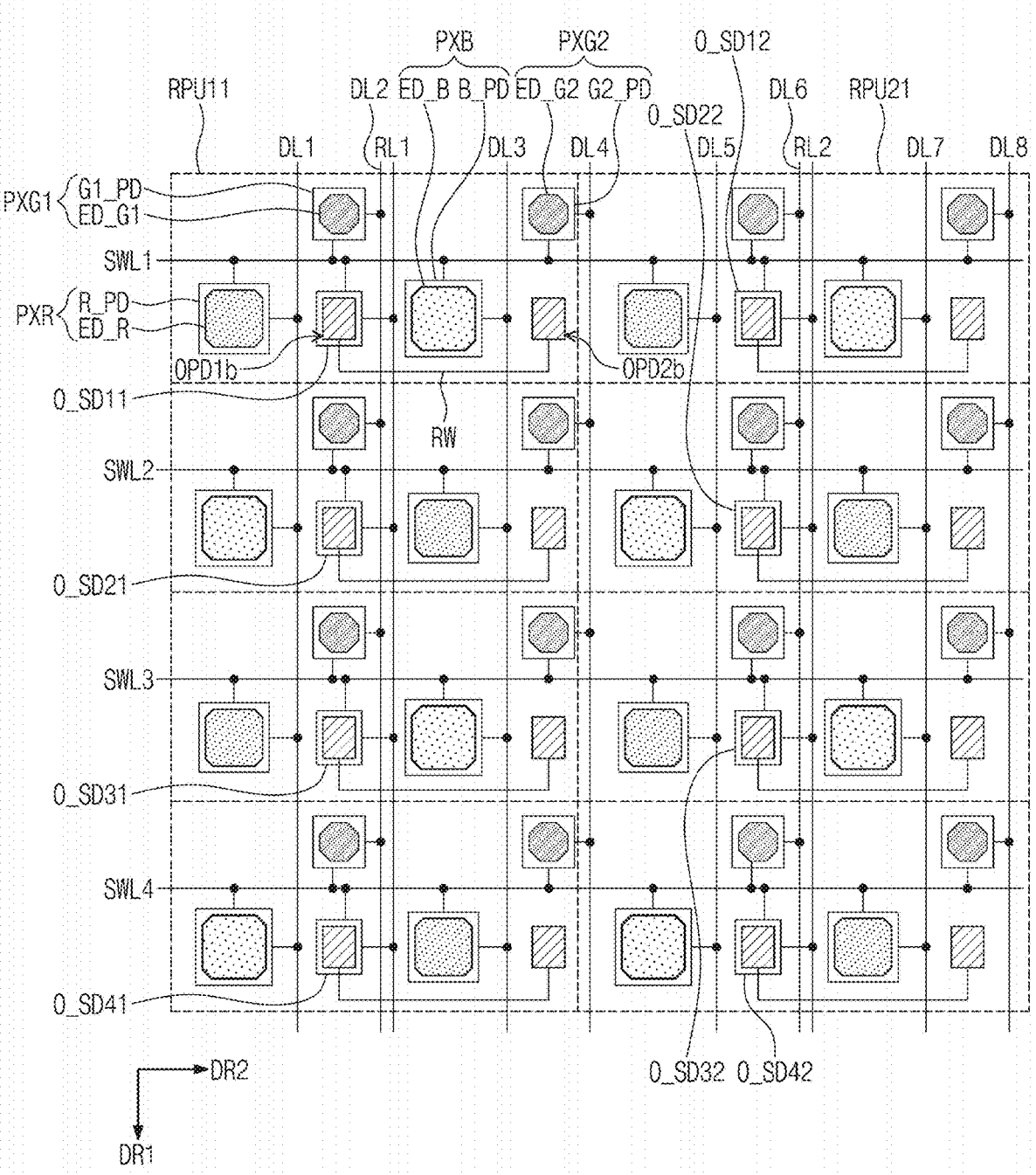
FIG. 8B is a circuit diagram illustrating the connection relationship between the light sensing unit and the sensor drive circuit illustrated in FIG. 8A.
Figure 8C:
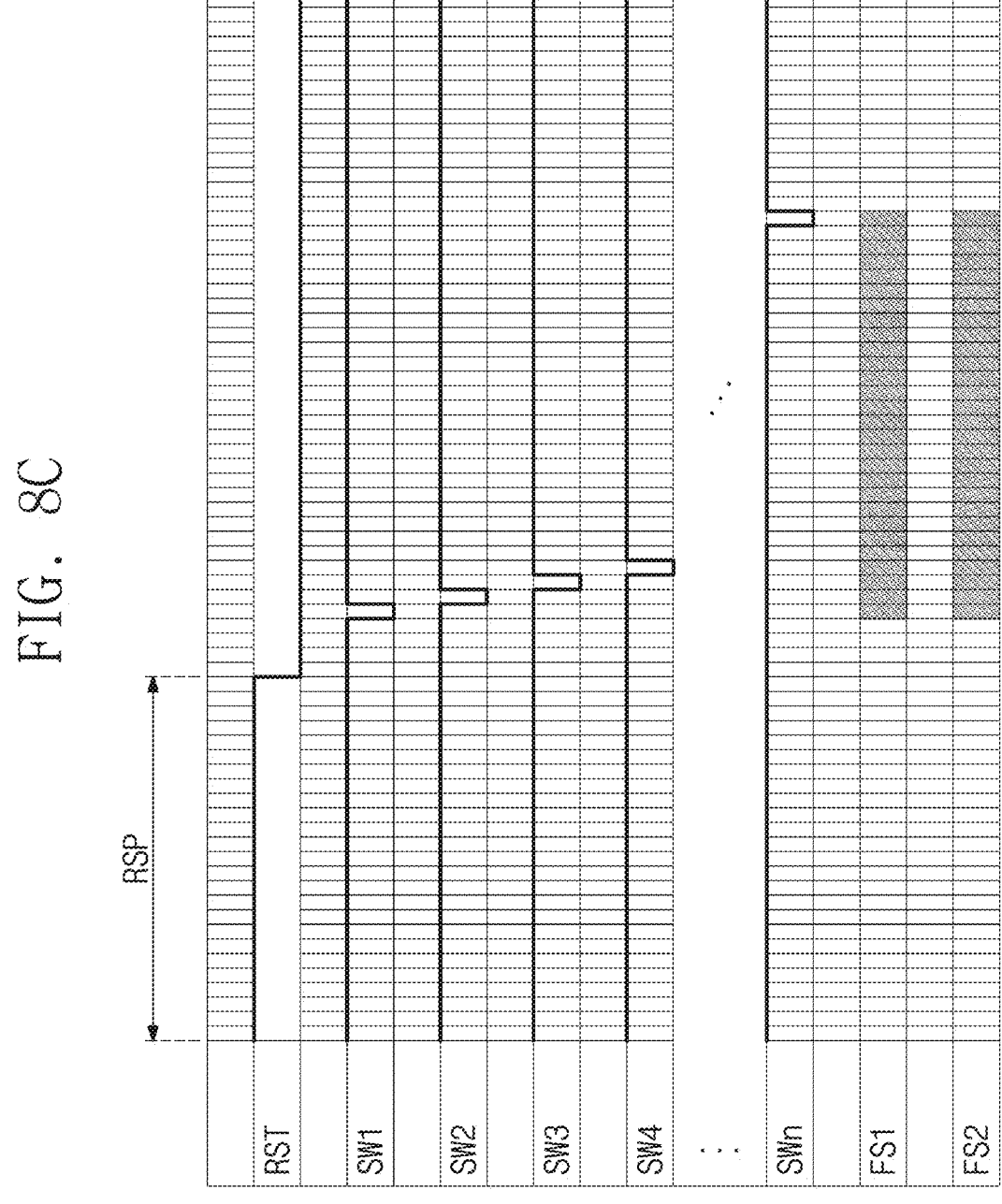
FIG. 8C is a waveform diagram illustrating readout timing of sensors illustrated in FIG. 8B according to an embodiment of the present disclosure.
Figure 8D:
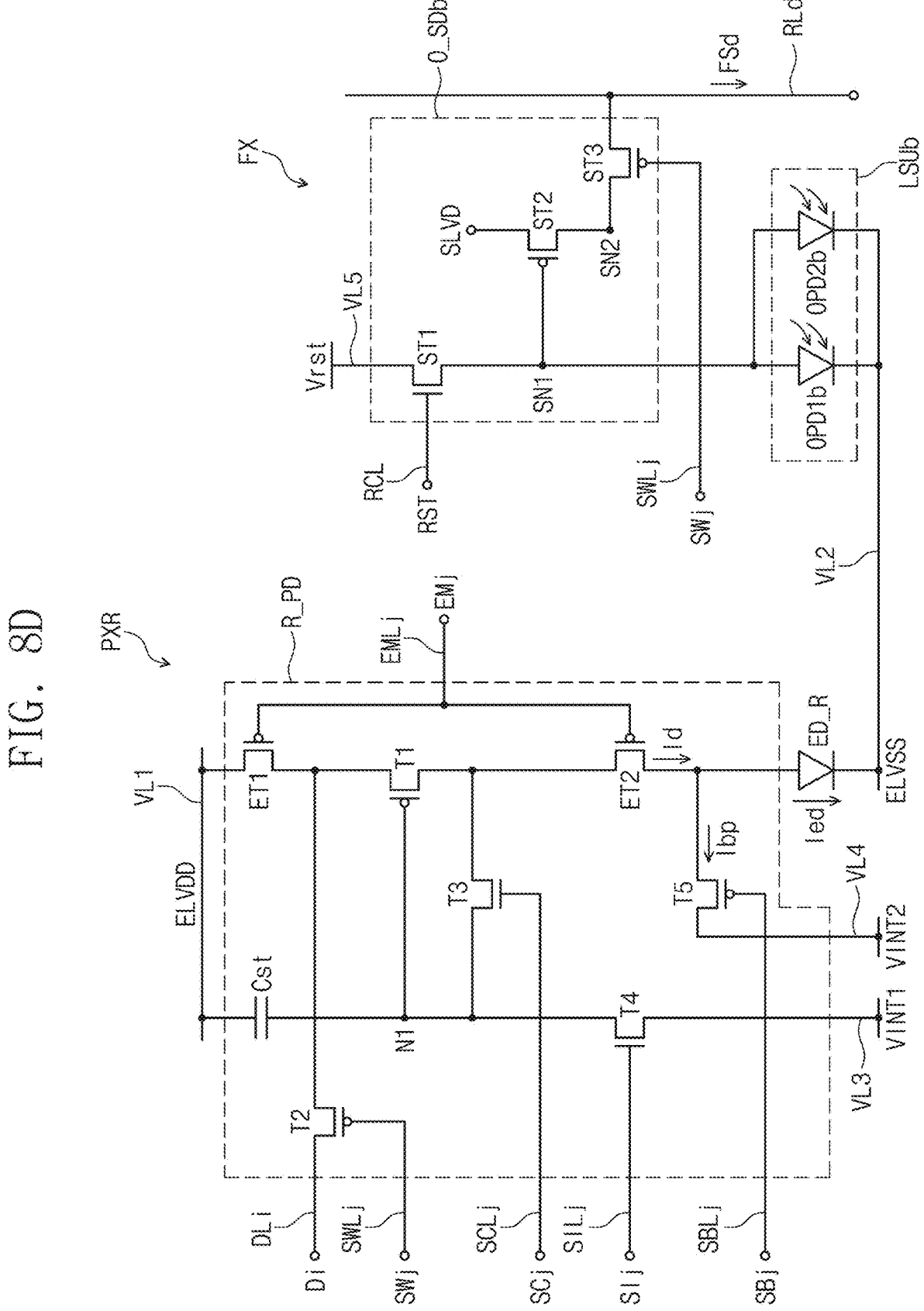
FIG. 8D is a circuit diagram illustrating a pixel and a sensor according to an embodiment of the present disclosure.

FIG. 8A is a plan view illustrating a connection relationship between a light sensing unit and a sensor drive circuit according to an embodiment of the present disclosure. FIG. 8B is a circuit diagram illustrating the connection relationship between the light sensing unit and the sensor drive circuit illustrated in FIG. 8A. FIG. 8C is a waveform diagram illustrating readout timing of sensors illustrated in FIG. 8B according to an embodiment of the present disclosure. FIG. 8D is a circuit diagram illustrating a pixel and a sensor according to an embodiment of the present disclosure.

Referring to FIG. 8A, each of sensors FX includes a light sensing unit LSUb and a sensor drive circuit O_SDb. In an embodiment of the present disclosure, the light sensing unit LSUb includes k light sensing elements, and one of the k light sensing elements is directly connected to the sensor drive circuit O_SDb. FIG. 8A illustrates one example that k is 2. When k is 2, the light sensing unit LSUb includes first and second light sensing elements OPD1*b* and OPD2*b*. One of the first and second light sensing elements OPD1*b* and OPD2*b* (e.g., the first light sensing element OPD1*b*) is directly connected to the sensor drive circuit O_SDb. The other of the first and second light sensing elements OPD1*b* and OPD2*b* (e.g., the second light sensing element OPD2*b*) is connected to the sensor drive circuit O_SDb through a routing wire RW. In an embodiment of the present disclosure, the first and second light sensing elements OPD1*b* and OPD2*b* may be arranged in the second direction DR2.

A light sensing element OPD1*b* disposed in a left most portion of the light sensing units LSUb in odd-numbered rows is directly connected to a corresponding sensor drive circuit O_SDb. A light sensing element OPD1*b* disposed in a left most portion of the light sensing units LSUb in even-numbered rows is directly connected to a corresponding sensor drive circuit O_SDb.

The first light sensing element OPD1*b* includes a first anode electrode O_AE1 and a first photoelectric conversion layer O_RL1, and the second light sensing element OPD2*b* includes a second anode electrode O_AE2 and a second photoelectric conversion layer O_RL2.

Each of the sensors FX may further include the routing wire RW electrically connecting the first and second light sensing elements OPD1*b* and OPD2*b*. The routing wire RW electrically connects the first and second light sensing elements OPD1*b* and OPD2*b*. The routing wire RW is electrically connected to the first anode electrode O_AE1 and the second anode electrode O_AE2. In an embodiment of the present disclosure, the routing wire RW may be integrally formed with the first and second anode electrodes O_AE1 and O_AE2.

The routing wires RW and the first and second anode electrodes O_AE1 and O_AE2 may be disposed on the same layer as anode electrodes R_AE, G1_AE, G2_AE, and B_AE. In this case, the routing wires RW and the first and second anode electrodes O_AE1 and O_AE2 may contain the same material as the anode electrodes R_AE, G1_AE, G2_AE, and B_AE and may be provided through the same process.

One sensor drive circuit O_SDb may be disposed per one reference pixel unit. The sensor drive circuit O_SDb may be disposed in an area having the same length as red and blue pixel drive circuits R_PD and B_PD in the first direction DR1. The sensor drive circuits O_SDb are arranged in a matrix form in the first and second directions DR1 and DR2.

Referring to FIG. 8B, one scan line (e.g., one write scan line) and one readout line may be connected to each of the sensor drive circuits. A first write scan line SWL1 and a first readout line RL1 are connected to a first sensor drive circuit O_SD11 among the sensor drive circuits, and the first write scan line SWL1 and a second readout line RL2 are connected to a second sensor drive circuit O_SD12. A second write scan line SWL2 and the first readout line RL1 are connected to a third sensor drive circuit O_SD21 among the sensor drive circuits, and the second write scan line SWL2 and the second readout line RL2 are connected to a fourth sensor drive circuit O_SD22.

A third write scan line SWL3 and the first readout line RL1 are connected to a fifth sensor drive circuit O_SD31 among the sensor drive circuits, and the third write scan line SWL3 and the second readout line RL2 are connected to a sixth sensor drive circuit O_SD32. A fourth write scan line SWL4 and the first readout line RL1 are connected to a seventh sensor drive circuit O_SD41 among the sensor drive circuits, and the fourth write scan line SWL4 and the second readout line RL2 are connected to an eighth sensor drive circuit O_SD42.

The light sensing unit LSUb includes the first and second light sensing elements OPD1*b* and OPD2*b*. Each of the sensor drive circuits O_SD11 to O_SD42 is directly connected to one of the first and second light sensing elements OPD1*b* and OPD2*b* (e.g., the first light sensing element OPD1*b*). The other of the first and second light sensing elements OPD1*b* and OPD2*b* (e.g., the second light sensing element OPD2*b*) may be connected to a corresponding sensor drive circuit O_SD through a routing wire RW. Each of the sensor drive circuits O_SD11 to O_SD42 may be disposed to overlap one of the first and second light sensing elements OPD1*b* and OPD2*b* (e.g., the first light sensing element OPD1*b*).

Referring to FIGS. 8B and 8C, the sensor drive circuits O_SD11 to O_SD42 are electrically connected to the corresponding write scan lines SWL1 to SWL4. Accordingly, the sensor drive circuits O_SD11 to O_SD42 may output first and second sensing signals FS1 and FS2 to the first and second readout lines RL1 and RL2 during activation periods of write scan signals SW1 to SW4 applied to the corresponding write scan lines SWL1 to SWL4.

Referring to FIG. 8D, the sensor FX is connected to the d-th readout line RLd among the readout lines RL1 to RLh, the j-th write scan line SWLj, and the reset control line RCL.

The sensor FX includes the light sensing unit LSUb and the sensor drive circuit O_SDb. The light sensing unit LSUb may include k light sensing elements connected in parallel. When k is 2, two light sensing elements (that is, the first and second light sensing elements OPD1*b* and OPD2*b*) may be connected to the sensor drive circuit O_SDb in parallel. Each of the first and second light sensing elements OPD1*b* and OPD2*b* may be a photo diode. In an embodiment of the present disclosure, each of the first and second light sensing elements OPD1*b* and OPD2*b* may be an organic photo diode containing an organic material as a photoelectric conversion layer. The first and second anode electrodes O_AE1 and O_AE2 of the first and second light sensing elements OPD1*b* and OPD2*b* (refer to FIG. 8B) may be connected to a first sensing node SN1, and first and second cathode electrodes of the first and second light sensing elements OPD1*b* and OPD2*b* may be connected to a second drive voltage line VL2 that transfers a second drive voltage ELVSS.

The structure and operation of the sensor drive circuit O_SDb are the same as those of the sensor drive circuit O_SD illustrated in FIG. 5B, and therefore descriptions of the structure and operation of the sensor drive circuit O_SDb are omitted.

Figure 9A:
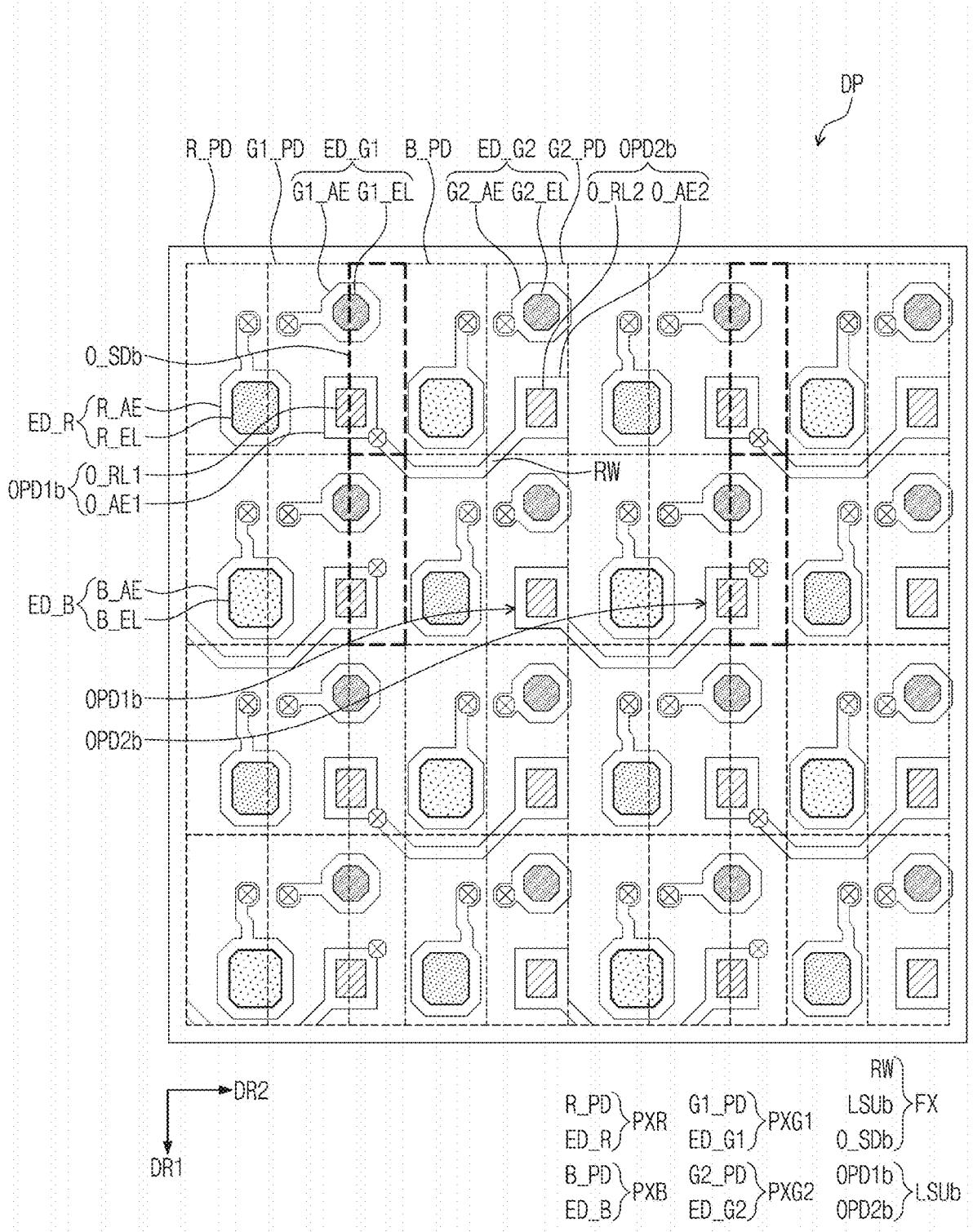
FIG. 9A is a plan view illustrating a connection relationship between a light sensing unit and a sensor drive circuit according to an embodiment of the present disclosure.
Figure 9B:
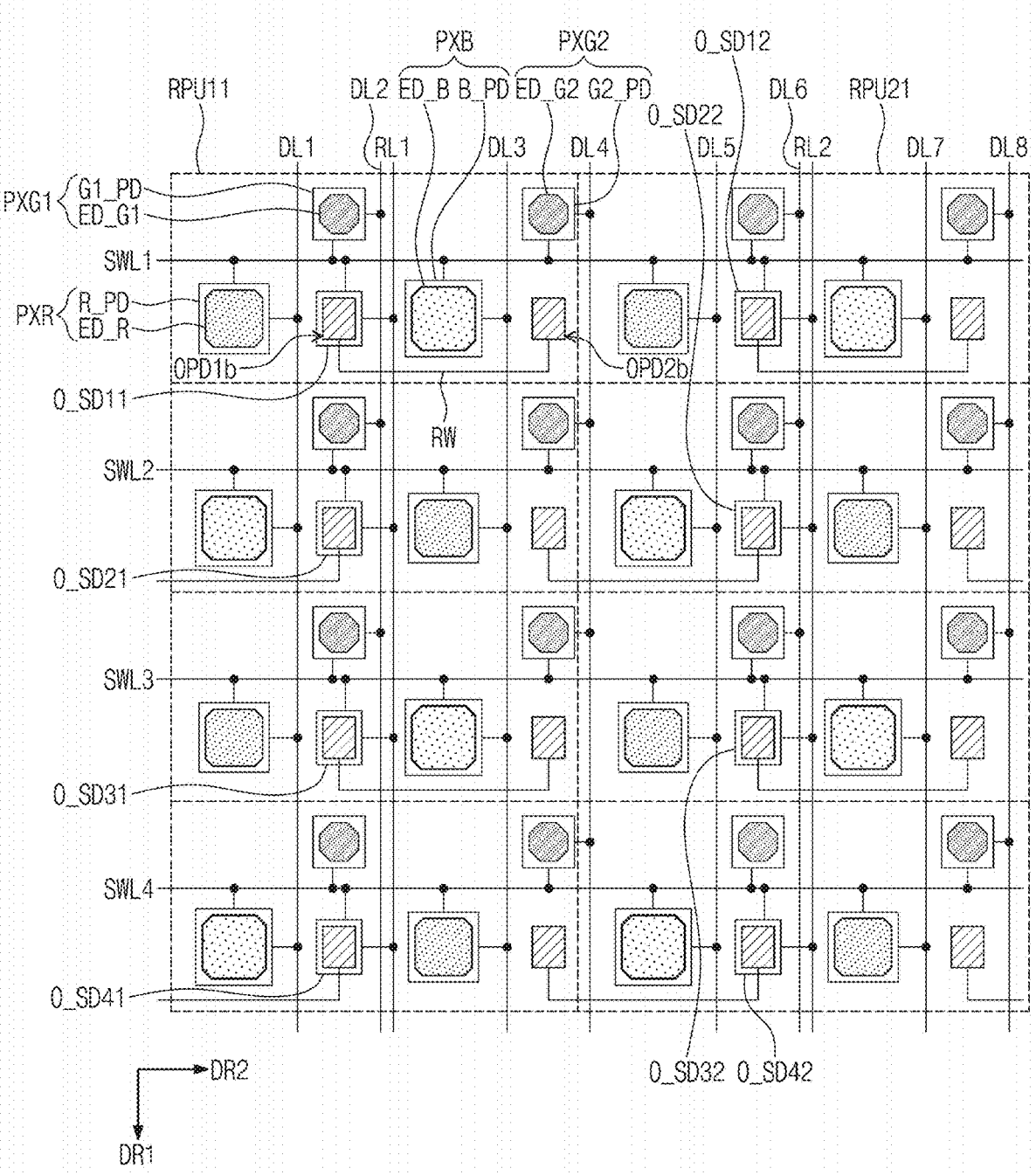
FIG. 9B is a circuit diagram illustrating the connection relationship between the light sensing unit and the sensor drive circuit illustrated in FIG. 9A.

FIG. 9A is a plan view illustrating a connection relationship between a light sensing unit and a sensor drive circuit according to an embodiment of the present disclosure. FIG. 9B is a circuit diagram illustrating the connection relationship between the light sensing unit and the sensor drive circuit illustrated in FIG. 9A.

Referring to FIG. 9A, each of the sensors FX includes a light sensing unit LSUb and a sensor drive circuit O_SDb. In an embodiment of the present disclosure, the light sensing unit LSUb includes k light sensing elements, and one of the k light sensing elements is directly connected to the sensor drive circuit O_SDb. The other of the k light sensing elements is connected to the sensor drive circuit O_SDb through a routing wire RW. FIG. 9A illustrates one example that k is 2. When k is 2, the light sensing unit LSUb includes first and second light sensing elements OPD1*b* and OPD2*b*. The one of the first and second light sensing elements OPD1*b* and OPD2*b* (e.g., the first light sensing element OPD1*b*) is directly connected to the sensor drive circuit O_SDb. The other of the first and second light sensing elements OPD1*b* and OPD2*b* (e.g., the second light sensing element OPD2*b*) is connected to the sensor drive circuit O_SDb through a routing wire RW.

In an embodiment of the present disclosure, the first and second light sensing elements OPD1*b* and OPD2*b* may be disposed in a first row and arranged in the second direction DR2. When the light sensing element directly connected to the sensor drive circuit O_SDb is referred to as the first light sensing element OPD1*b*, in odd-numbered rows, the second light sensing element OPD2*b* may be located on the right side of the first light sensing element OPD1*b*. In even-numbered rows, the second light sensing element located on the right side of the first light sensing element is directly connect to a sensor drive circuit O_SD.

In light sensing units disposed in the odd-numbered rows among the light sensing units LSUb, the first light sensing element OPD1*b* located at the left portion is directly connected to a corresponding sensor drive circuit O_SDb. In light sensing units disposed in the even-numbered rows among the light sensing units LSUb, the second light sensing element OPD2*b* located at the right portion is directly connected to a corresponding sensor drive circuit O_SDb.

The first light sensing element OPD1*b* includes a first anode electrode O_AE1 and a first photoelectric conversion layer O_RL1, and the second light sensing element OPD2*b* includes a second anode electrode O_AE2 and a second photoelectric conversion layer O_RL2.

Each of the sensors FX may further include the routing wire RW electrically connecting the first and second light sensing elements OPD1*b* and OPD2*b*. The routing wire RW electrically connects the first and second light sensing elements OPD1*b* and OPD2*b*. The routing wire RW is electrically connected to the first anode electrode O_AE1 and the second anode electrode O_AE2. In an embodiment of the present disclosure, the routing wire RW may be integrally formed with the first and second anode electrodes O_AE1 and O_AE2.

One sensor drive circuit O_SDb may be disposed per one reference pixel unit RPU. The sensor drive circuits O_SDb are arranged in a matrix form in the first and second directions DR1 and DR2.

Referring to FIG. 9B, one scan line (e.g., one write scan line) and one readout line may be connected to each of the sensor drive circuits. A first write scan line SWL1 and a first readout line RL1 are connected to a first sensor drive circuit O_SD11 among the sensor drive circuits, and the first write scan line SWL1 and a second readout line RL2 are connected to a second sensor drive circuit O_SD12. A second write scan line SWL2 and the first readout line RL1 are connected to a third sensor drive circuit O_SD21 among the sensor drive circuits, and the second write scan line SWL2 and the second readout line RL2 are connected to a fourth sensor drive circuit O_SD22.

A third write scan line SWL3 and the first readout line RL1 are connected to a fifth sensor drive circuit O_SD31 among the sensor drive circuits, and the third write scan line SWL3 and the second readout line RL2 are connected to a sixth sensor drive circuit O_SD32. A fourth write scan line SWL4 and the first readout line RL1 are connected to a seventh sensor drive circuit O_SD41 among the sensor drive circuits, and the fourth write scan line SWL4 and the second readout line RL2 are connected to an eighth sensor drive circuit O_SD42.

The sensor drive circuits O_SD11 to O_SD42 are electrically connected to the corresponding write scan lines SWL1 to SWL4. Accordingly, the sensor drive circuits O_SD11 to O_SD42 may output first and second sensing signals FS1 and FS2 (refer to FIG. 8C) to the first and second readout lines RL1 and RL2 during activation periods of write scan signals SW1 to SW4 (refer to FIG. 8C) applied to the corresponding write scan lines SWL1 to SWL4.

Figure 10:
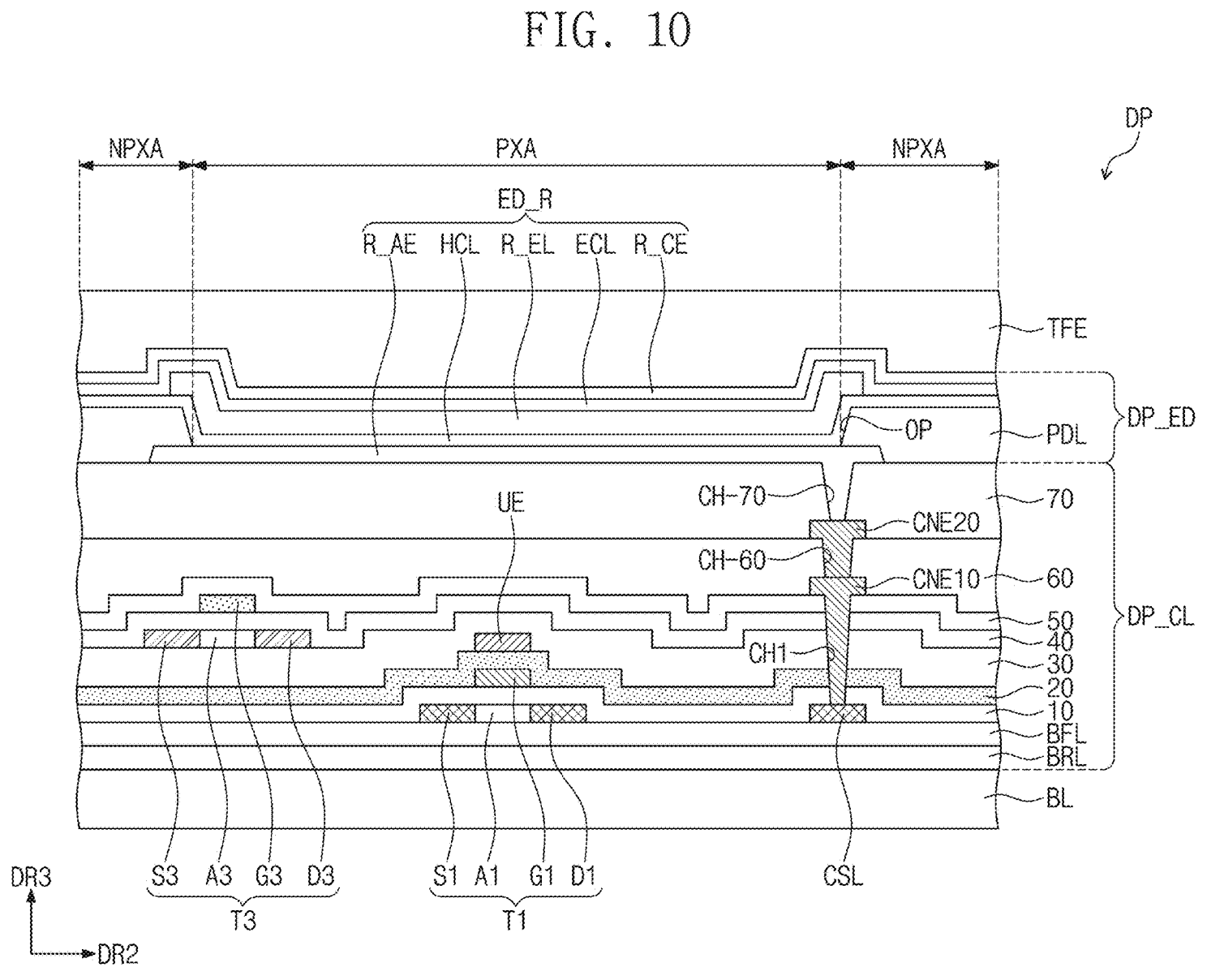
Figure 11A:
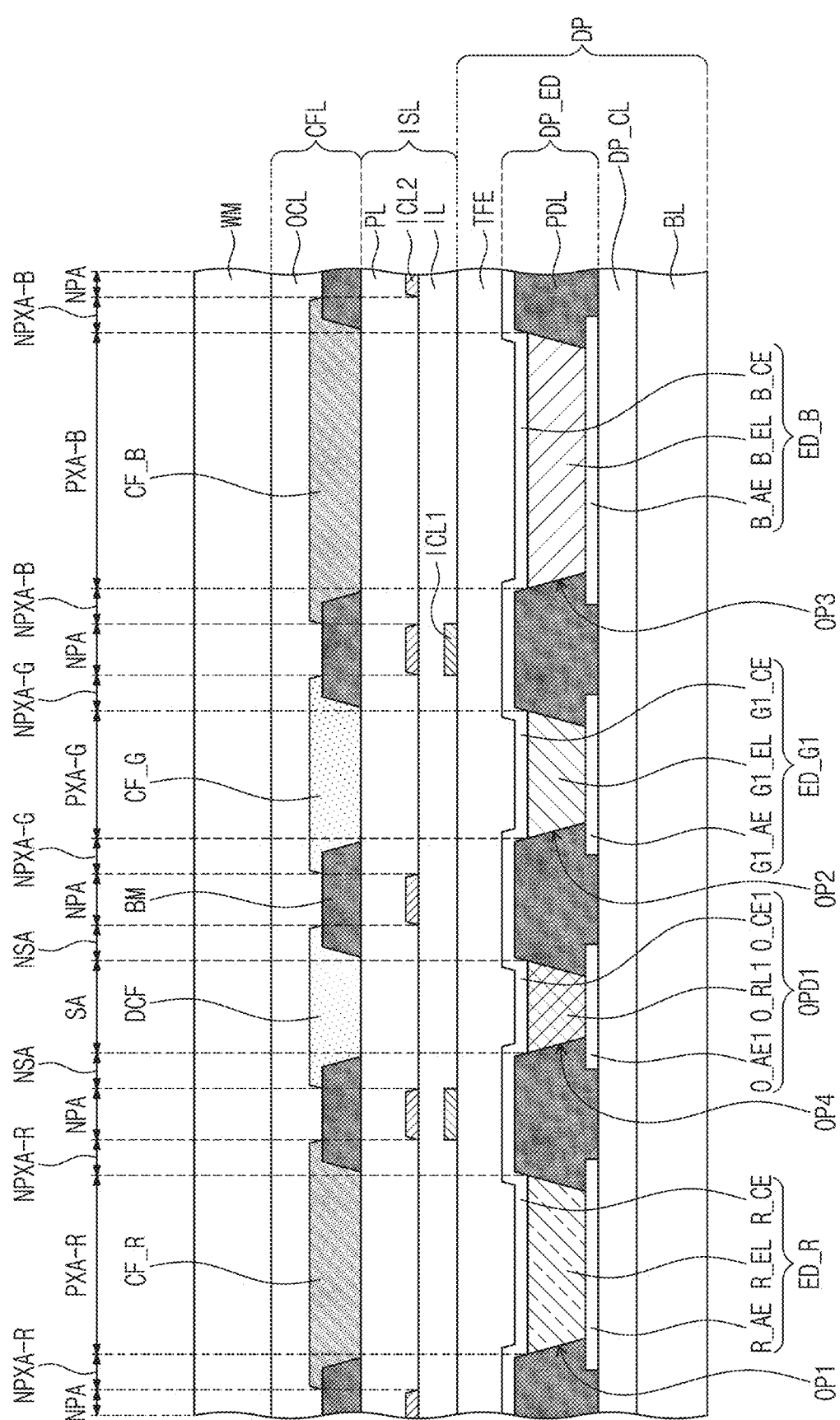
FIGS. 11A and 11B are sectional views illustrating a light emitting element and a light sensing element of the display panel according to an embodiment of the present disclosure.
Figure 11B:
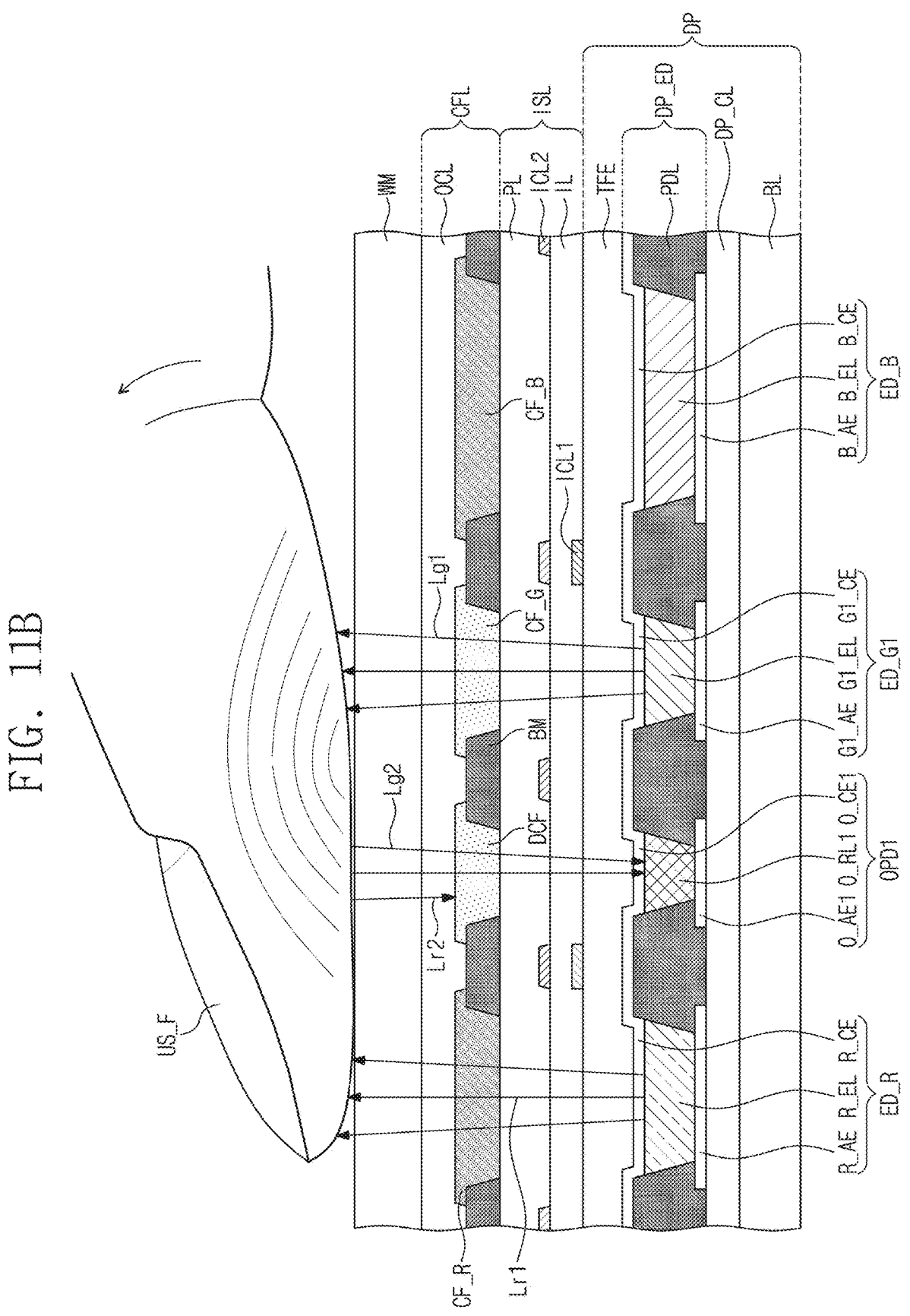

FIG. 10 is a sectional view illustrating a pixel of the display panel according to an embodiment of the present disclosure. FIGS. 11A and 11B are sectional views illustrating a light emitting element and a light sensing element of the display panel according to an embodiment of the present disclosure.

Referring to FIGS. 10 and 11A, the display panel DP may include the base layer BL, and the circuit layer DP_CL, the element layer DP_ED, and the encapsulation layer TFE disposed on the base layer BL.

The base layer BL may include a synthetic resin layer. The synthetic resin layer may contain a thermosetting resin. In particular, the synthetic resin layer may be a polyimide-based resin layer, and the material thereof is not particularly limited. The synthetic resin layer may contain at least one of an acrylate-based resin, a methacrylate-based resin, a poly-isoprene-based resin, a vinyl-based resin, an epoxy-based resin, a urethane-based resin, a celluose-based resin, a siloxane-based resin, a polyamide-based resin, and a perylene-based resin. In addition, the base layer BL may include a glass substrate, a metal substrate, or an organic/inorganic composite substrate.

At least one inorganic layer is formed on the upper surface of the base layer BL. The inorganic layer may contain at least one of aluminum oxide, titanium oxide, silicon oxide, silicon oxy-nitride, zirconium oxide, and hafnium oxide. The inorganic layer may be formed in multiple layers. The multiple inorganic layers may constitute a barrier layer BRL and/or a buffer layer BFL that will be described below. The barrier layer BRL and the buffer layer BF may be selectively disposed.

The barrier layer BRL prevents infiltration of foreign matter from the outside. The barrier layer BRL may include a silicon oxide layer and a silicon nitride layer. A plurality of silicon oxide layers and a plurality of silicon nitride layers may be provided. The silicon oxide layers and the silicon nitride layers may be alternately stacked one above another.

The buffer layer BFL may be disposed on the barrier layer BRL. The buffer layer BFL may improve the coupling force between the base layer BL and a semiconductor pattern and/or a conductive pattern. The buffer layer BFL may include silicon oxide layers and silicon nitride layers. The silicon oxide layers and the silicon nitride layers may be alternately stacked one above another. One of the barrier layer BRL and the buffer layer BFL may be omitted.

The semiconductor pattern is disposed on the buffer layer BFL. Hereinafter, the semiconductor pattern directly disposed on the buffer layer BFL is defined as the first semiconductor pattern. The first semiconductor pattern may include a silicon semiconductor. The first semiconductor pattern may contain poly-silicon. However, without being limited thereto, the first semiconductor pattern may contain amorphous silicon.

FIG. 10 merely illustrates a portion of the first semiconductor pattern, and the first semiconductor pattern may be additionally disposed in another area of the pixel PXR (refer to FIG. 5A). The first semiconductor pattern has different electrical properties depending on whether the first semiconductor pattern is doped or not. The first semiconductor pattern may include a doped area and an undoped area. The doped area may be doped with an N-type dopant or a P-type dopant. A P-type transistor may include a doped area doped with a P-type dopant, and an N-type transistor may include a doped area doped with an N-type dopant.

The doped area has a higher conductivity than the undoped area and substantially serves as an electrode or a signal line. The undoped area substantially corresponds to an active area (or, a channel) of a transistor. In other words, one portion of the first semiconductor pattern may be an active area of a transistor, another portion may be a source or drain of the transistor, and another portion may be a connecting signal line (or, a connecting electrode).

As illustrated in FIG. 10, the first electrode S1, a channel part A1, and the second electrode D1 of the first transistor T1 are formed from the first semiconductor pattern. The first electrode S1 and the second electrode D1 of the first transistor T1 extend from the channel part A1 in opposite directions.

In FIG. 10, a portion of a connecting signal line CSL formed from the semiconductor pattern is illustrated. Although not separately illustrated, the connecting signal line CSL may be connected to the second electrode of the second light emission control transistor ET2 (refer to FIG. 5A) in a plan view.

A first insulating layer 10 is disposed on the buffer layer BFL. The first insulating layer 10 commonly overlaps the plurality of pixels PX (refer to FIG. 3) and covers the first semiconductor pattern. The first insulating layer 10 may be an inorganic layer and/or an organic layer and may have a single-layer structure or a multi-layer structure. The first insulating layer 10 may contain at least one of aluminum oxide, titanium oxide, silicon oxide, silicon oxy-nitride, zirconium oxide, and hafnium oxide. In this embodiment, the first insulating layer 10 may be a single silicon oxide layer. Not only the first insulating layer 10 but also insulating layers of the circuit layer DP_CL to be described below may be inorganic layers and/or organic layers and may have a single-layer structure or a multi-layer structure. The inorganic layers may contain at least one of the aforementioned materials.

The third electrode G1 of the first transistor T1 is disposed on the first insulating layer 10. The third electrode G1 may be a portion of a metal pattern. The third electrode G1 of the first transistor T1 overlaps the channel part A1 of the first transistor T1. The third electrode G1 of the first transistor T1 may serve as a self-aligned mask in a process of doping the first semiconductor pattern.

A second insulating layer 20 that covers the third electrode G1 is disposed on the first insulating layer 10. The second insulating layer 20 commonly overlaps the plurality of pixels PX. The second insulating layer 20 may be an inorganic layer and/or an organic layer and may have a single-layer structure or a multi-layer structure. In this embodiment, the second insulating layer 20 may be a single silicon oxide layer.

An upper electrode UE may be disposed on the second insulating layer 20. The upper electrode UE may overlap the third electrode G1 in a plan view. The upper electrode UE may be a portion of a metal pattern, or may be a portion of a doped semiconductor pattern. A portion of the third electrode G1 and the upper electrode UE overlapping the portion of the third electrode G1 may form the capacitor Cst (refer to FIG. 5A). In an embodiment of the present disclosure, the upper electrode UE may be omitted.

In an embodiment of the present disclosure, the second insulating layer 20 may be replaced with an insulating pattern. The upper electrode UE is disposed on the insulating pattern. The upper electrode UE may serve as a mask that forms the insulating pattern from the second insulating layer 20.

A third insulating layer 30 that covers the upper electrode UE is disposed on the second insulating layer 20. In this embodiment, the third insulating layer 30 may be a single silicon oxide layer. A semiconductor pattern is disposed on the third insulating layer 30. Hereinafter, the semiconductor pattern directly disposed on the third insulating layer 30 is defined as the second semiconductor pattern. The second semiconductor pattern may contain metal oxide. An oxide semiconductor may include a crystalline or amorphous oxide semiconductor. For example, the oxide semiconductor may contain metal oxide of zinc (Zn), indium (In), gallium (Ga), tin (Sn), or titanium (Ti), or may contain metal such as zinc (Zn), indium (In), gallium (Ga), tin (Sn), or titanium (Ti) and a mixture of oxide thereof. The oxide semiconductor may contain indium-tin oxide (ITO), indium-gallium-zinc oxide (IGZO), zinc oxide (ZnO), indium-zinc oxide (IZO), zinc-indium oxide (ZIO), indium oxide (InO), titanium oxide (TiO), indium-zinc-tin oxide (IZTO), or zinc-tin oxide (ZTO).

FIG. 10 merely illustrates a portion of the second semiconductor pattern, and the second semiconductor pattern may be additionally disposed in another area of the pixel PXR (refer to FIG. 5A). The second semiconductor pattern may include a plurality of areas distinguished depending on whether metal oxide is reduced or not. An area where metal oxide is reduced (hereinafter, referred to as the reduced area) has a higher conductivity than an area where metal oxide is not reduced (hereinafter, referred to as the non-reduced area). The reduced area substantially serves as an electrode or a signal line. The non-reduced area substantially corresponds to a channel part of a transistor. In other words, one portion of the second semiconductor pattern may be a channel part of a transistor, and another portion may be a first electrode or a second electrode of the transistor.

As illustrated in FIG. 10, the first electrode S3, a channel part A3, and the second electrode D3 of the third transistor T3 are formed from the second semiconductor pattern. The first electrode S3 and the second electrode D3 contain metal reduced from a metal oxide semiconductor. The first electrode S3 and the second electrode D3 may include a metal layer having a predetermined thickness from the upper surface of the second semiconductor pattern and containing the reduced metal.

A fourth insulating layer 40 that covers the second semiconductor pattern is disposed on the third insulating layer 30. In this embodiment, the fourth insulating layer 40 may be a single silicon oxide layer. The third electrode G3 of the third transistor T3 is disposed on the fourth insulating layer 40. The third electrode G3 may be a portion of a metal pattern. The third electrode G3 of the third transistor T3 overlaps the channel part A3 of the third transistor T3.

In an embodiment of the present disclosure, the fourth insulating layer 40 may be replaced with an insulating pattern. The third electrode G3 of the third transistor T3 is disposed on the insulating pattern. In this embodiment, the third electrode G3 may have the same shape as the insulating pattern in a plan view. Although one third electrode G3 is illustrated in this embodiment for convenience of description, the third transistor T3 may include two third electrodes.

A fifth insulating layer 50 that covers the third electrode G3 is disposed on the fourth insulating layer 40. In this embodiment, the fifth insulating layer 50 may include a silicon oxide layer and a silicon nitride layer. The fifth insulating layer 50 may include a plurality of silicon oxide layers and a plurality of silicon nitride layers alternately stacked one above another.

Although not illustrated, the first electrode and the second electrode of the fourth transistor T4 (refer to FIG. 5A) may be formed through the same process as the first electrode S3 and the second electrode D3 of the third transistor T3. Furthermore, the first and second electrodes of the reset transistor ST1 (refer to FIG. 5A) of the sensor FX (refer to FIG. 5A) and the first and second electrodes of the output transistor ST3 (refer to FIG. 5A) of the sensor FX may be simultaneously formed through the same process as the first electrode S3 and the second electrode D3 of the third transistor T3.

At least one insulating layer is additionally disposed on the fifth insulating layer 50. As in this embodiment, a sixth insulating layer 60 and a seventh insulating layer 70 may be disposed on the fifth insulating layer 50. The sixth insulating layer 60 and the seventh insulating layer 70 may be organic layers and may have a single-layer structure or a multi-layer structure. Each of the sixth insulating layer 60 and the seventh insulating layer 70 may be a single polyimide-based resin layer. Without being limited thereto, the sixth insulating layer 60 and the seventh insulating layer 70 may contain at least one of an acrylate-based resin, a methacrylate-based resin, a polyisoprene-based resin, a vinyl-based resin, an epoxy-based resin, a urethane-based resin, a celluose-based resin, a siloxane-based resin, a polyamide-based resin, and a perylene-based resin.

A first connecting electrode CNE10 may be disposed on the fifth insulating layer 50. The first connecting electrode CNE10 may be connected to the connecting signal line CSL through a first contact hole CH1 formed through the first to fifth insulating layers 10 to 50, and a second connecting electrode CNE20 may be connected to the first connecting electrode CNE10 through a contact hole CH-60 formed through the sixth insulating layer 60. In an embodiment of the present disclosure, at least one of the fifth, sixth, and seventh insulating layers 50, 60, and 70 may be omitted.

The element layer DP_ED includes the red light emitting element ED_R and a pixel defining film PDL. The red anode electrode R_AE of the red light emitting element ED_R is disposed on the seventh insulating layer 70. The red anode electrode R_AE of the red light emitting element ED_R may be connected to the second connecting electrode CNE20 through a contact hole CH-70 formed through the seventh insulating layer 70.

The pixel defining film PDL may be disposed on the red anode electrode R_AE of the red light emitting element ED_R. An opening OP may be defined in the pixel defining film PDL. The opening OP of the pixel defining film PDL exposes at least a portion of the red anode electrode R_AE of the red light emitting element ED_R. The opening OP of the pixel defining film PDL may define an emissive area PXA. For example, the plurality of pixels PX (refer to FIG. 3) may be disposed on the plane of the display panel DP (refer to FIG. 3) according to a predetermined rule. The area where the plurality of pixels PX are disposed may be defined as a pixel area, and one pixel area may include an emissive area PXA and a non-emissive area NPXA disposed adjacent to the emissive area PXA. The non-emissive area NPXA may surround the emissive area PXA.

A hole control layer HCL may be commonly disposed in the emissive area PXA and the non-emissive area NPXA. A common layer, such as the hole control layer HCL, may be commonly formed for the plurality of pixels PX. The hole control layer HCL may include a hole transporting layer and a hole injection layer.

The red light emitting layer R_EL is disposed on the hole control layer HCL. The red light emitting layer R_EL may be disposed only in the area corresponding to the opening OP. The red light emitting layer R_EL may be separately formed in each of the plurality of pixels PX.

Although the patterned red light emitting layer R_EL is illustrated in this embodiment, the present disclosure is not limited thereto. A common light emitting layer may be commonly disposed for the plurality of pixels PX. In this case, the common light emitting layer may generate white light or blue light.

An electron control layer ECL is disposed on the red light emitting layer R_EL. The electron control layer ECL may include an electron transporting layer and an electron injection layer. The cathode electrode R_CE of the red light emitting element ED_R is disposed on the electron control layer ECL. The electron control layer ECL and the cathode electrode R_CE are commonly disposed for the plurality of pixels PX.

The encapsulation layer TFE is disposed on the cathode electrode R_CE. The encapsulation layer TFE may cover the plurality of pixels PX. In this embodiment, the encapsulation layer TFE directly covers the cathode electrode R_CE. In an embodiment of the present disclosure, the display panel DP may further include a capping layer that directly covers the cathode electrode R_CE. In an embodiment of the present disclosure, the stacked structure of the red light emitting element ED_R may have a structure in which the structure illustrated in FIG. 10 is inverted.

Referring to FIGS. 11A and 11B, a first electrode layer is disposed on the circuit layer DP_CL. The pixel defining film PDL is formed on the first electrode layer. The first electrode layer may include the red, green, and blue anodes R_AE, G1_AE, and B_AE. First to third openings OP1, OP2, and OP3 of the pixel defining film PDL expose at least portions of the red, green, and blue anode electrodes R_AE, G1_AE, and B_AE, respectively. In an embodiment of the present disclosure, the pixel defining film PDL may additionally contain a black material. The pixel defining film PDL may additionally contain a black organic dye/pigment, such as carbon black, aniline black, or the like. The pixel defining film PDL may be formed by mixing a blue organic material and a black organic material. The pixel defining film PDL may additionally contain a liquid-repellent organic material.

As illustrated in FIG. 11A, the display panel DP may include first to third emissive areas PXA-R, PXA-G, and PXA-B and first to third non-emissive areas NPXA-R, NPXA-G, and NPXA-B disposed adjacent to the first to third emissive areas PXA-R, PXA-G, and PXA-B. The non-emissive areas NPXA-R, NPXA-G, and NPXA-B may surround the corresponding emissive areas PXA-R, PXA-G, and PXA-B, respectively. In this embodiment, the first emissive area PXA-R is defined to correspond to a partial area of the red anode electrode R_AE exposed by the first opening OP1. The second emissive area PXA-G is defined to correspond to a partial area of the green anode electrode G1_AE exposed by the second opening OP2. The third emissive area PXA-B is defined to correspond to a partial area of the blue anode electrode B_AE exposed by the third opening OP3. A non-pixel area NPA may be defined between the first to third non-emissive areas NPXA-R, NPXA-G, and NPXA-B.

A light emitting layer may be disposed on the first electrode layer. The light emitting layer may include the red, green, and blue light emitting layers R_EL, G1_EL, and B_EL. The red, green, and blue light emitting layers R_EL, G1_EL, and B_EL may be disposed in areas corresponding to the first to third openings OP1, OP2, and OP3, respectively. The red, green, and blue light emitting layers R_EL, G1_EL, and B_EL may be separately formed in the red, green, and blue pixels PXR, PXG1, and PXB (refer to FIG. 4B), respectively. Each of the red, green, and blue light emitting layers R_EL, G1_EL, and B_EL may contain an organic material and/or an inorganic material. The red, green, and blue light emitting layers R_EL, G1_EL, and B_EL may generate light beams having predetermined colors. For example, the red light emitting layer R_EL may generate red light, the green light emitting layer G1_EL may generate green light, and the blue light emitting layer B_EL may generate blue light.

Although the patterned red, green, and blue light emitting layers R_EL, G1_EL, and B_EL are illustrated in this embodiment, one light emitting layer may be commonly disposed in the first to third emissive areas PXA-R, PXA-G, and PXA-B. In this case, the light emitting layer may generate white light or blue light. Furthermore, the light emitting layer may have a multi-layer structure called a tandem structure.

Each of the red, green, and blue light emitting layers R_EL, G1_EL, and B_EL may contain a low molecular weight organic material or a high molecular weight organic material as a luminescent material. Alternatively, each of the red, green, and blue light emitting layers R_EL, G1_EL, and B_EL may contain a quantum-dot material as a luminescent material. A core of a quantum dot may be selected from Group II-VI compounds, Group III-V compounds, Group IV-VI compounds, Group IV elements, Group IV compounds, and combinations thereof.

A second electrode layer is disposed on the light emitting layer. The second electrode layer may include the red, green, and blue cathode electrodes R_CE, G1_CE, and B_CE. The red, green, and blue cathode electrodes R_CE, G1_CE, and B_CE may be electrically connected to one another. In an embodiment of the present disclosure, the red, green, and blue cathode electrodes R_CE, G1_CE, and B_CE may be integrally formed. In this case, the red, green, and blue cathode electrodes R_CE, G1_CE, and B_CE may be commonly disposed in the first to third emissive areas PXA-R, PXA-G, and PXA-B, the first to third non-emissive areas NPXA-R, NPXA-G, and NPXA-B, and the non-pixel area NPA.

The element layer DP_ED may further include the light sensing elements OPD1 to OPD4 (refer to FIG. 4A). Each of the light sensing elements OPD1 to OPD4 may be a photo diode. The pixel defining film PDL may further include fourth openings OP4 provided to correspond to the light sensing elements OPD1 to OPD4.

The first light sensing element OPD1 may include the first anode electrode O_AE1, the first photoelectric conversion layer O_RL1, and the first cathode electrode O_CE1. The first anode electrode O_AE1 may be disposed on the same layer as the first electrode layer. That is, the first anode electrode O_AE1 may be disposed on the circuit layer DP_CL and may be simultaneously formed through the same process as the red, green, and blue anode electrodes R_AE, G1_AE, and B_AE.

The fourth opening OP4 of the pixel defining film PDL exposes at least a portion of the first anode electrode O_AEL. The first photoelectric conversion layer O_RL1 is disposed on the first anode electrode O_AE1 exposed by the fourth opening OP4. The first photoelectric conversion layer O_RL1 may contain an organic photo sensing material. The first cathode electrode O_CE1 may be disposed on the first photoelectric conversion layer O_RL1. The first cathode electrode O_CE1 may be simultaneously formed through the same process as the red, green, and blue cathode electrodes R_CE, G1_CE, and B_CE. In an embodiment of the present disclosure, the first cathode electrode O_CE1 may be integrally formed with the red, green, and blue cathode electrodes R_CE, G1_CE, and B_CE.

The first anode electrode O_AE1 and the first cathode electrode O_CE1 may each receive an electrical signal. The first cathode electrode O_CE1 and the first anode electrode O_AE1 may receive different signals. Accordingly, a predetermined electric field may be formed between the first anode electrode O_AE1 and the first cathode electrode O_CE1. The first photoelectric conversion layer O_RL1 generates an electrical signal corresponding to light incident on the sensor. The first photoelectric conversion layer O_RL1 may generate charges by absorbing energy of the incident light. For example, the first photoelectric conversion layer O_RL1 may contain a photosensitive semiconductor material.

The charges generated in the first photoelectric conversion layer O_RL1 change the electric field between the first anode electrode O_AE1 and the first cathode electrode O_CE1. The amount of charges generated in the first photoelectric conversion layer O_RL1 may vary depending on whether light is incident on the first light sensing element OPD1 and the amount and intensity of light incident on the first light sensing element OPD1. Accordingly, the electric field formed between the first anode electrode O_AE1 and the first cathode electrode O_CE1 may vary. The first light sensing element OPD1 according to the present disclosure may obtain fingerprint information of the user through the change in the electric field between the first anode electrode O_AE1 and the first cathode electrode O_CE1.

However, this is illustrative, and the first light sensing element OPD1 may include a phototransistor having the first photoelectric conversion layer O_RL1 as an active layer. In this case, the first light sensing element OPD1 may obtain fingerprint information by sensing the amount of current flowing through the phototransistor. The first light sensing element OPD1 according to an embodiment of the present disclosure may include various photoelectric conversion elements capable of generating an electrical signal in response to a change in the amount of light and is not limited to any one embodiment.

The encapsulation layer TFE is disposed on the element layer DP_ED. The encapsulation layer TFE includes at least an inorganic layer or an organic layer. In an embodiment of the present disclosure, the encapsulation layer TFE may include two inorganic layers and an organic layer disposed therebetween. In an embodiment of the present disclosure, the encapsulation layer TFE may include a plurality of inorganic layers and a plurality of organic layers that are alternately stacked one above another.

The inorganic encapsulation layer protects the red, green, and blue light emitting elements ED_R, ED_G1, and ED_B and the first light sensing element OPD1 from moisture/oxygen, and the organic encapsulation layer protects the red, green, and blue light emitting elements ED_R, ED_G1, and ED_B and the first light sensing element OPD1 from foreign matter such as dust particles. The inorganic encapsulation layer may include, but is not particularly limited to, a silicon nitride layer, a silicon oxy-nitride layer, a silicon oxide layer, a titanium oxide layer, or an aluminum oxide layer. The organic encapsulation layer may include, but is not particularly limited to, an acrylate-based organic layer.

The display device DD includes the input sensing layer ISL disposed on the display panel DP and the color filter layer CFL disposed on the input sensing layer ISL.

The input sensing layer ISL may be directly disposed on the encapsulation layer TFE. The input sensing layer ISL includes a first conductive layer ICL1, an insulating layer IL, a second conductive layer ICL2, and a protective layer PL. The first conductive layer ICL1 may be disposed on the encapsulation layer TFE. Although FIGS. 11A and 11B illustrate the structure in which the first conductive layer ICL1 is directly disposed on the encapsulation layer TFE, the present disclosure is not limited thereto. The input sensing layer ISL may further include a base insulating layer disposed between the first conductive layer ICL1 and the encapsulation layer TFE. In this case, the encapsulation layer TFE may be covered by the base insulating layer, and the first conductive layer ICL1 may be disposed on the base insulating layer. In an embodiment of the present disclosure, the base insulating layer may contain an inorganic insulating material.

The insulating layer IL may cover the first conductive layer ICL1. The second conductive layer ICL2 is disposed on the insulating layer IL. Although FIGS. 11A and 11B illustrate the structure in which the input sensing layer ISL includes the first and second conductive layers ICL1 and ICL2, the present disclosure is not limited thereto. For example, the input sensing layer ISL may include only one of the first and second conductive layers ICL1 and ICL2.

The protective layer PL may be disposed on the second conductive layer ICL2. The protective layer PL may contain an organic insulating material. The protective layer PL may serve to protect the first and second conductive layers ICL1 and ICL2 from moisture/oxygen and protect the first and second conductive layers ICL1 and ICL2 from foreign matter.

The color filter layer CFL may be disposed on the input sensing layer ISL. The color filter layer CFL may be directly disposed on the protective layer PL. The color filter layer CFL may include a first color filter CF_R, a second color filter CF_G, and a third color filter CF_B. The first color filter CF_R has a first color, the second color filter CF_G has a second color, and the third color filter CF_B has a third color. In an embodiment of the present disclosure, the first color may be red, the second color may be green, and the third color may be blue.

The color filter layer CFL may further include a dummy color filter DCF. In an embodiment, when the area where the first photoelectric conversion layer O_RL1 is disposed is defined as a sensing area SA and an area around the sensing area SA is defined as a non-sensing area NSA, the dummy color filter DCF may be disposed to correspond to the sensing area SA. The dummy color filter DCF may overlap the sensing area SA and the non-sensing area NSA. In an embodiment of the present disclosure, the dummy color filter DCF may have the same color as one of the first to third color filters CF_R, CF_G, and CF_B. In an embodiment of the present disclosure, the dummy color filter DCF may have the same green color as the second color filter CF_G.

The color filter layer CFL may further include a black matrix BM. The black matrix BM may be disposed to correspond to the non-pixel area NPA. The black matrix BM may be disposed to overlap the first and second conductive layers ICL1 and ICL2 in the non-pixel area NPA. In an embodiment of the present disclosure, the black matrix BM may overlap the non-pixel area NPA and the first to third non-emissive areas NPXA-G, NPXA-B, and NPXA-R. The black matrix BM may not overlap the first to third emissive areas PXA-R, PXA-G, and PXA-B.

The color filter layer CFL may further include an over-coating layer OCL. The over-coating layer OCL may contain an organic insulating material. The over-coating layer OCL may have a thickness sufficient to remove steps between the first to third color filters CF_R, CF_G, and CF_B. Without any specific limitation, the over-coating layer OCL may contain any material that has a predetermined thickness and is capable of flattening the upper surface of the color filter layer CFL. For example, the over-coating layer OCL may contain an acrylate-based organic material.

Referring to FIG. 11B, when the display device DD (refer to FIG. 1) operates, the red, green, and blue light emitting elements ED_R, ED_G1, and ED_B may output light. The red light emitting elements ED_R output red light in a red wavelength band, the green light emitting elements ED_G1 output green light in a green wavelength band, and the blue light emitting elements ED_B output blue light in a blue wavelength band.

In an embodiment of the present disclosure, the first light sensing element OPD1 may receive light from specific light emitting elements (e.g., the green light emitting element ED_G1) among the red, green, and blue light emitting elements ED_R, ED_G1, and ED_B. That is, the green light Lg1 may be output from the green light emitting elements ED_G1, and the first light sensing element OPD1 may receive second reflected light Lg2 obtained by reflection of the green light Lg1 by the user's fingerprint. The dummy color filter DCF is disposed over the first light sensing element OPD1. The dummy color filter DCF may be green in color. Accordingly, the second reflected light Lg2 may pass through the dummy color filter DCF and may be incident on the first light sensing element OPD1.

Meanwhile, the red light and the blue light output from the red and blue light emitting elements ED_R and ED_B may also be reflected by the user's hand US_F. For example, when light obtained by reflection of the red light Lr1 output from the red light emitting elements ED_R by the user's hand US_F is defined as first reflected light Lr2, the first reflected light Lr2 fails to pass through the dummy color filter DCF and may be absorbed by the dummy color filer DCF. Accordingly, the first reflected light Lr2 fails to pass through the dummy color filter DCF and cannot be incident on the first light sensing element OPD1. Likewise, even though blue light is reflected by the user's hand US_F, the blue light may be absorbed by the dummy color filter DCF. Accordingly, only the second reflected light Lg2 may be provided to the first light sensing element OPD1.

According to the embodiments of the present disclosure, by increasing the number of light sensing elements by k times the number of sensor drive circuits, the overall amount of light received by a sensor in the display panel may be increased, and thus the sensing performance of the sensor may be improved.

Furthermore, even though the number of light sensing elements included in the display panel is increased, the number of sensor drive circuits is smaller than the number of light sensing elements, and thus the resolution of the display panel may be prevented from being degraded due to an increase in the number of sensor drive circuits.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A display device comprising:
a base layer; and
a pixel layer disposed on the base layer, the pixel layer including a plurality of pixels and a plurality of sensors,
wherein each of the plurality of pixels includes:
a light emitting element, and
a pixel drive circuit connected to the light emitting element to control driving of the light emitting element,
wherein each of the plurality of sensors includes:
a light sensing unit including a plurality of light sensing elements, and
a sensor drive circuit connected to at least two light sensing elements and configured to output a sensing signal in response to light,
wherein a first pixel drive circuit of a first pixel among the plurality of pixels and a second pixel drive circuit of a second pixel among the plurality of pixels are disposed in a first row, and a third pixel drive circuit of a third pixel among the plurality of pixels and a fourth pixel drive circuit of a fourth pixel among the plurality of pixels are disposed in a second row, and
wherein only one sensor drive circuit is disposed between the first pixel drive circuit and the second pixel drive circuit in the first row, and between the third pixel drive circuit and the fourth pixel drive circuit in the second row.

2. The display device of claim 1, wherein each of the at least two light sensing elements includes:
an anode electrode,
a photoelectric conversion layer disposed on the anode electrode, and
a cathode electrode disposed on the photoelectric conversion layer, and
wherein the sensor drive circuit is directly connected to the anode electrode of one of the at least two light sensing elements.

3. The display device of claim 2, wherein the anode electrodes of the at least two light sensing elements are electrically connected to each other by a routing wire.

4. The display device of claim 1, wherein the plurality of pixels are grouped into a plurality of reference pixel units including four pixels, and
each of a plurality of reference pixel units corresponds to one among the plurality of light sensing elements.

5. The display device of claim 4, wherein the sensor drive circuit is disposed in an area corresponding to two reference pixel units among the plurality of reference pixel units in a first direction.

6. The display device of claim 5, wherein the light sensing unit includes two light sensing elements,
wherein the two light sensing elements are arranged in a second direction perpendicular to the first direction.

7. The display device of claim 5, wherein a first light sensing element of the two light sensing elements overlaps the sensor drive circuit and a second light sensing element of the two light sensing elements overlaps one of the first to fourth pixel drive circuits.

8. The display device of claim 1, wherein
the sensor drive circuit is disposed between the first pixel drive circuit and the second pixel drive circuit in an odd-numbered row and is not disposed between the third pixel drive circuit and the fourth pixel drive circuit in the odd-numbered row,
the sensor drive circuit is disposed between the third pixel drive circuit and the fourth pixel drive circuit in an even-numbered row and is not disposed between the first pixel drive circuit and the third pixel drive circuit in the even-numbered row.

9. The display device of claim 1, wherein the sensor drive circuit is longer than each of the first to fourth pixel drive circuits in a first direction.

10. The display device of claim 1, wherein the pixel drive circuit includes:
a first transistor connected between a first drive voltage line configured to receive a first drive voltage and the light emitting element;
a second transistor connected between a data line and a first electrode of the first transistor; and
a third transistor connected between a second electrode of the first transistor and a gate electrode of the first transistor, and
wherein the third transistor is an oxide semiconductor transistor.

11. The display device of claim 10, wherein the sensor drive circuit includes:
a reset transistor including a first electrode configured to receive a reset signal, a second electrode connected to a first sensing node, and a third electrode configured to receive a reset control signal;
an amplifying transistor including a first electrode configured to receive a sensing drive voltage, a second electrode connected to a second sensing node, and a third electrode connected to the first sensing node; and
an output transistor including a first electrode connected to the second sensing node, a second electrode connected to a sensing line, and a third electrode configured to receive an output control signal, and
wherein the reset transistor is an oxide semiconductor transistor.

12. An electronic device comprising:
a display panel;
a panel driver driving the display panel; and
a driving controller controlling the panel driver,
wherein the display panel comprises:
a base layer; and
a pixel layer disposed on the base layer, the pixel layer including a plurality of pixels and a plurality of sensors,
wherein each of the plurality of pixels includes:
a light emitting element, and
a pixel drive circuit connected to the light emitting element to control driving of the light emitting element,
wherein each of the plurality of sensors includes:
a light sensing unit including a plurality of light sensing elements, and
a sensor drive circuit connected to at least two light sensing elements and configured to output a sensing signal in response to light,
wherein a first pixel drive circuit of a first pixel among the plurality of pixels and a second pixel drive circuit of a second pixel among the plurality of pixels are disposed in a first row and a third pixel drive circuit of a third pixel among the plurality of pixels and a fourth pixel drive circuit of a fourth pixel among the plurality of pixels are disposed in a second row, and
wherein only one sensor drive circuit is disposed between the first pixel drive circuit and the second pixel drive circuit in the first row, and between the third pixel drive circuit and the fourth pixel drive circuit in the second row.

13. The electronic device of claim 12, wherein each of the at least two light sensing elements includes:

an anode electrode, a photoelectric conversion layer disposed on the anode electrode, and a cathode electrode disposed on the photoelectric conversion layer, and wherein the sensor drive circuit is directly connected to the anode electrode of one of the at least two light sensing elements.

14. The electronic device of claim 13, wherein the anode electrodes of the at least two light sensing elements are electrically connected to each other by a routing wire.

15. The electronic device of claim 12, wherein the plurality of pixels are grouped into a plurality of reference pixel units including four pixels, and each of a plurality of reference pixel units corresponds to one among the plurality of light sensing elements.

16. The electronic device of claim 15, wherein the sensor drive circuit is disposed in an area corresponding to two reference pixel units among the plurality of reference pixel units in a first direction.

17. The electronic device of claim 16, wherein the light sensing unit includes two light sensing elements, wherein the two light sensing elements are arranged in a second direction perpendicular to the first direction.

18. The electronic device of claim 16, wherein a first light sensing element of the two light sensing elements overlaps the sensor drive circuit and a second light sensing element of the two light sensing elements overlaps one of the first to fourth pixel drive circuits.

19. The electronic device of claim 12, wherein the sensor drive circuit is disposed between the first pixel drive circuit and the second pixel drive circuit in an odd-numbered row and is not disposed between the third pixel drive circuit and the fourth pixel drive circuit in the odd-numbered row, the sensor drive circuit is disposed between the third pixel drive circuit and the fourth pixel drive circuit in an even-numbered row and is not disposed between the first pixel drive circuit and the third pixel drive circuit in the even-numbered row.

20. The electronic device of claim 12, wherein the sensor drive circuit is longer than each of the first to fourth pixel drive circuits in a first direction.

* * * * *